United States Patent [19]

Shimada et al.

[11] Patent Number: 4,866,291
[45] Date of Patent: Sep. 12, 1989

[54] PHOTOSENSOR WITH CHARGE STORAGE UNIT AND SWITCH UNIT FORMED ON A SINGLE-CRYSTAL SEMICONDUCTOR FILM

[75] Inventors: Tetsuya Shimada, Zama; Satoshi Itabashi, Atsugi; Katsunori Hatanaka, Yokohama, all of Japan

[73] Assignee: Canon Kabushiki Kaisha, Tokyo, Japan

[21] Appl. No.: 211,031

[22] Filed: Jun. 24, 1988

[30] Foreign Application Priority Data

| Jun. 30, 1987 | [JP] | Japan | 62-162577 |
| Jun. 30, 1987 | [JP] | Japan | 62-162578 |
| Jun. 30, 1987 | [JP] | Japan | 62-162579 |
| Jun. 30, 1987 | [JP] | Japan | 62-162581 |

[51] Int. Cl.$^4$ .................................... H01J 40/14
[52] U.S. Cl. ................................. 250/578; 357/23.7
[58] Field of Search ............. 250/211 J, 578; 357/4, 357/23.7

[56] References Cited

U.S. PATENT DOCUMENTS

| 4,763,183 | 8/1988 | Ng et al. | 357/23.7 |
| 4,791,493 | 12/1988 | Ogura et al. | 250/578 |

*Primary Examiner*—David C. Nelms
*Assistant Examiner*—Eric F. Chatmon
*Attorney, Agent, or Firm*—Fitzpatrick, Cella, Harper & Scinto

[57] ABSTRACT

An image photosensor includes a photosensor unit a charge storage unit, and a switch unit, all of which are formed on a single-crystal semiconductor film grown from a single nucleus such that crystal formation is performed on a substrate having a free surface including a non-nucleus formation surface and a nucleus formation surface adjacent thereto. The non-nucleus formation surface has a low nucleation density. The nucleus formation surface has a sufficiently small area to allow growth of only the single nucleus and has a higher nucleation density than that of the non-nucleus formation surface.

18 Claims, 25 Drawing Sheets

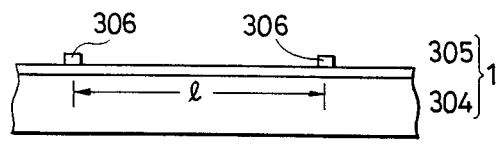
FIG. 20A
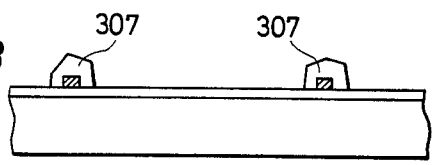
FIG. 20B
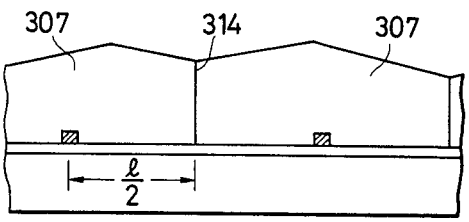
FIG. 20C
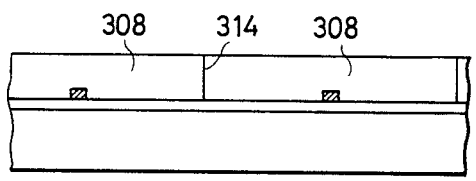
FIG. 20D
FIG. 20E
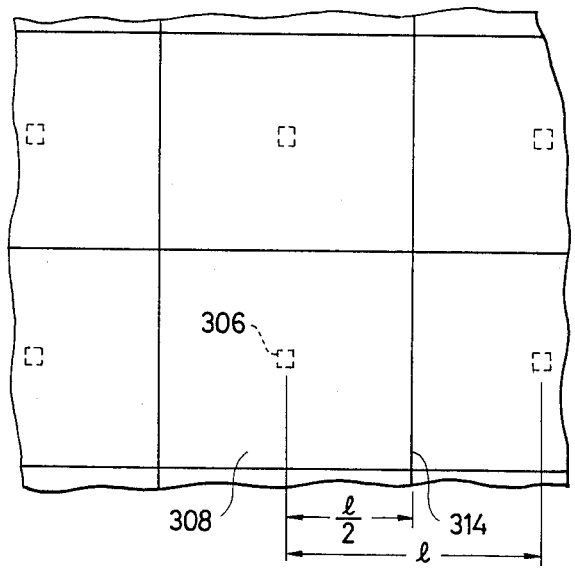

PHOTOSENSOR WITH CHARGE STORAGE UNIT AND SWITCH UNIT FORMED ON A SINGLE-CRYSTAL SEMICONDUCTOR FILM

BACKGROUND OF THE INVENTION

1. Field of the Invention

The present invention relates to a photosensor and, more particularly to an image input photosensor.

2. Related Background Art

In a known conventional image reading apparatus using a one-dimensional line sensor, an original image is focused on the one-dimensional line sensor having a length of several cm by using a reduction optical system, and original image information is then read. In an image reading apparatus of this type, however, a long optical path length is required because the original image is reduced or focused. In addition, the volume of the optical system is large and a compact reading apparatus cannot be obtained.

When a one-to-one magnification optical system having a one-dimensional line sensor having a length equal to the width of the original is used, the volume of the optical system can be greatly reduced, and a compact reading apparatus can be obtained.

FIG. 1 is a schematic view of an image reading apparatus using such an optical system.

Referring to FIG. 1, an original P is fed by a feed roller 41 rotatably supported by a shaft 40 in the f direction. A reader 42 comprises a leaf spring 43 disposed to oppose the feed roller 41 to elastically urge the original P against the feed roller 41 along the entire width of the original P, an LED array 44 serving as an illuminating means for illuminating the original P, an optical system 45 obtained by arranging focusing optical fibers for focusing light reflected by the original P, a transducer 46 including a photoelectric transducer element (photosensor) for photoelectrically converting the focused light, and a holding member 47 for holding the above components.

Upon rotation of the feed roller 41 by a driving means (not shown), the original P urged by the leaf spring or the press member 43 toward the feed roller 41 is guided and fed along the f direction. During feeding, the original surface is illuminated with light from the LED array 44, and light reflected by the original surface is incident on the transducer 46 through the optical system 45. Therefore, the image portions are sequentially read.

Assigner of the present invention proposed methods of reading images according to a contact method (Japanese Unexamined Patent Publications Nos. 55-74262, 55-75271, 56-45084, and 56-122172) without using such optical fibers and such a lens array. According to the contact method, an original is moved in contact with a one-dimensional line sensor to read the image from the original.

FIG. 2 shows such an image reading apparatus. An incident light window 51 is formed in a mounting base 50, and light from a light source 52 is incident through the incident window 51. A transducer 53 and an electronic circuit 54 of an IC for processing an optical signal from the transducer 53 are arranged on the mounting base 50. Light emitted through the incident light window 51 is incident through the transducer 53 on the original P fed by a feed roller 55. Light reflected by the original P is read by the photosensor in the transducer 53.

Typical photosensors used in such an image reading apparatus are a thin-film sensor obtained by using a photoconductive film and an amorphous silicon film (a-Si), and a multi-chip sensor using a plurality of CCD sensor chips.

The a-Si film element has a function for storing optical carriers in a capacitor in an element. The light-sensitive time is the same as the one-line scanning time. Therefore, the a-Si film element is excellent in sensitivity and optical response, better than those of CdS and CdSe. However, as compared with single-crystal Si, a-Si has a lower mobility and is not suitable for high-speed reading.

Although a CCD sensor consisting of single-crystal Si can be operated at higher speed and higher sensitivity than the a-Si film sensor, a single-crystal Si sensor is arranged by connecting a plurality of chips. Therefore, a high packing density cannot be obtained, and signal processing is complicated, thus increasing cost.

FIG. 3 is a schematic view of an image reading apparatus using a one-to-one magnification optical system.

Referring to FIG. 3, an original P is fed by a feed roller (not shown) in the f direction, and a sensor unit 150 arranged under the lower surface of the original P reads original image information. The unit 150 includes a light source 151 serving as an illuminating means for illuminating the original P along the entire width of the original P, an optical system 152 of a SELFOC lens for focusing light reflected by the original P at a one-to-one magnification, and a photoelectric transducer 153 for photoelectrically converting light reflected by the original P.

The transducer 153 causes a photosensor to photoelectrically convert light into electrical signals and sequentially send the electrical signals to a signal processing unit in response to a clock signal from a control clock generator 154.

In the signal processing unit 155, an analog signal photoelectrically converted by the transducer 153 is converted into a digital signal by an A/D converter 156, and variations in sensitivity of the converted signals are corrected by a correction table memory 157 and a correction data memory 158. Therefore, a corrected signal is output from the signal processing unit 155. The above components in the signal processing unit 155 are controlled by the clock signal from a control clock generator 159.

FIGS. 4 and 5 are a perspective view and an equivalent circuit diagram, respectively, of the photoelectric transducer 153.

Referring to FIGS. 4 and 5, a photosensor unit 161 comprising photosensors S1 to Sn, a storage capacitor unit 162 comprising capacitors C1 to Cn, and a transfer unit 163 comprising transfer switches T1 to Tn and flip-flops F1 to Fn are formed on a substrate 160. The flip-flops F1 to Fn constitute a shift register. A bias voltage Vs is applied to the photosensors S1 to Sn, and clock pulses CP are supplied from a control clock generator 154 to clock terminals of the flip-flops F1 to Fn.

With the above arrangement, original image information is converted into a photocurrent by the photosensors S1 to Sn. The photocurrent is stored as a storage charge in the storage capacitors C1 to Cn for a predetermined period of time. The stored charge is output through the transfer unit 163.

When a normal silicon chip is used for a drive IC chip constituting the transfer unit in the conventional reading apparatus, the number of bonding portions between the photosensors and the IC chip is very large, resulting in high cost and decreasing product yield.

For example, when an A4-size original is read at a resolution of 400 pixels/inch, the number of photosensor elements is about 3,500. For this reason, when the number of bits per IC chip is given as 64 bits, 54 IC chips are required, and the number of bonding wires is as large as 3,500 to 5,000.

For the above reason, a conventional transfer unit comprises thin film transistors consisting of polycrystalline or amorphous silicon and formed on a substrate on which photosensors are formed. However, the electron mobilities of the polycrystalline and amorphous silicon are as small as 1/100 to 1/1000 of that of single-crystal silicon. The read speed of such an arrangement is limited. For example, it takes about 15 to 30 seconds to read each A4-size original. When this photosensor arrangement is used in a facsimile machine, only a low-speed machine is obtained.

Variations in photosensor sensitivity depend on individual photoelectric transducer units, and correction data must be prestored in a correction data memory prior to the read operation. As the correction data memory comprises a read/write memory (RWM), the contents of the memory must be backed up by a battery or the like after the power switch is turned off.

It is possible to store correction data in a read-only memory (ROM) as the correction data memory. In this case, variations in individual photosensor sensitivity in each photoelectric transducer unit must be measured, and the measurement results must be written in the ROM. This ROM must be provided to each transducer unit. Therefore, assembly, parts control, and transport control are complicated. For example, combinations of transducer units and ROMs may be mistaken, thus degrading reliability of the apparatus.

Different control clocks are required for an operation for reading the charge from the transducer unit and for an operation for reading correction data from the signal processing unit due to the following reason. The transducer unit must be driven by an n-stage shift register controlled by shift pulses, and a special power source system which satisfies the characteristics of the photosensors and the transfer switch must be driven. However, the signal processing unit is driven such that the memory is properly addressed. Therefore, two control clock generators must be used, thus increasing the cost.

A compact, low-cost image reading apparatus suitable for a high-performance line sensor cannot be proposed in which production control and steps can be simplified.

SUMMARY OF THE INVENTION

In consideration of the above situation, it is an object of the present invention to provide a multi-gradation, high-speed, high-resolution image input photosensor which has low cost and a large sensor area.

In order to achieve the above object, according to an embodiment of the present invention, a substrate having a free surface having a non-nucleus formation surface and a nucleus formation surface adjacent thereto is subjected to crystal formation to form a photosensor unit, a charge storage unit, and a switch unit in a single-crystal semiconductor layer, centered on a single nucleus. The non-nucleus formation surface has a low nucleation density and the nucleus formation surface has a very small area, enough to allow growth of only a single nucleus, and a nucleation density higher than that of the non-nucleus formation surface The single-crystal Si thin film is grown on a long insulating substrate according to selective growth of single-crystal Si on an amorphous insulating substrate. The photosensor unit, the charge storage unit, and the switch unit are formed on the thin film.

According to still another embodiment of the present invention, there is provided an image reading apparatus wherein a set of a sensor unit and a transfer unit for transferring an output signal from the sensor unit are formed on a substrate having at least an insulating surface layer. The signal transfer unit includes a single-crystal semiconductor layer on a nucleus formation surface consisting of a different material from that of the surface layer and having a micropattern on the insulating substrate, and the sensor unit is formed on the signal transfer unit, and there is also provided a method of manufacturing an image reading apparatus including a substrate with at least an insulating surface layer and a set of a sensor unit and a transfer unit for transferring an output signal from the sensor unit, the sensor unit and the transfer unit being formed on the insulating substrate, including the steps of forming on a surface portion of (1) the substrate a nucleus formation surface which has a sufficiently higher nucleation density than that of a material of the surface portion of the substrate, consists of a material different from that of the surface portion, and has a micropattern enough designed to allow (2) growth of only a single nucleus, growing a crystal centered on the single nucleus so as to form a single-crystal semiconductor layer on the surface of the substrate, (3) forming a single transfer unit in a portion including the semiconductor layer, and (4) forming a sensor unit on the signal transfer unit.

According to still another object of the present invention, there is provided an image reading apparatus wherein a set of a sensor unit and a transfer unit for transferring an output signal from the sensor unit are formed on a substrate having at least an insulating surface layer. The signal transfer unit includes a single-crystal semiconductor layer on a nucleus formation surface consisting of a different material from that of the insulating surface layer and having a micropattern on the insulating substrate. There is also provided a method of manufacturing an image reading apparatus including a substrate with at least an insulating surface layer and a set of a sensor unit and a transfer unit for transferring an output signal from the sensor unit, the sensor unit and the transfer unit being formed on the insulating substrate, including the steps of (1) forming on a surface portion of the substrate a nucleus formation surface which has a sufficiently higher nucleation density than that of a material of the surface portion of the substrate, consists of a different material from that of the surface portion, and has a micropattern designed to allow growth of only a single nucleus, (2) growing a crystal centered on the single nucleus so as to form a single-crystal semiconductor layer on the surface of the substrate, (3) forming a single transfer unit in a portion including the semiconductor layer, and (4) forming a sensor unit on the semiconductor layer.

According to still another embodiment of the present invention, a photoelectric transducer apparatus is characterized in that a substrate having a free surface having a non-nucleus formation surface and a nucleus formation surface adjacent thereto is subjected to crystal formation to form a photosensor unit, a transfer switch unit for time-serially outputting signals from the photosensor unit, a drive unit for driving the transfer switch unit, and an auxiliary memory for storing variations in sensitivity of photosensor elements in a single-crystal semiconductor layer, centered on a single nucleus. The non-nucleus formation surface has a low nucleation density, and the nucleus formation surface has a very small area designed to allow growth of only a single nucleus, and a nucleation density higher than that of the non-nucleus formation surface.

The photosensor, the transfer unit (e.g., the transfer switch and a shift register), and the auxiliary memory are formed on the substrate according to a technique for selectively growing a single-crystal semiconductor layer on the substrate including the nucleation and non-nucleus formation surfaces. Therefore, a high-speed, compact, low-cost apparatus having a high S/N ratio can be manufactured.

BRIEF DESCRIPTION OF THE DRAWINGS

FIGS. 20A to 20E and 21A to 21D are views for explaining steps in manufacturing the image reading apparatus according to the present invention;

DETAILED DESCRIPTION OF THE PREFERRED EMBODIMENTS

Preferred embodiments of the present invention will be described in detail with reference to the accompanying drawings.

Figure 6:
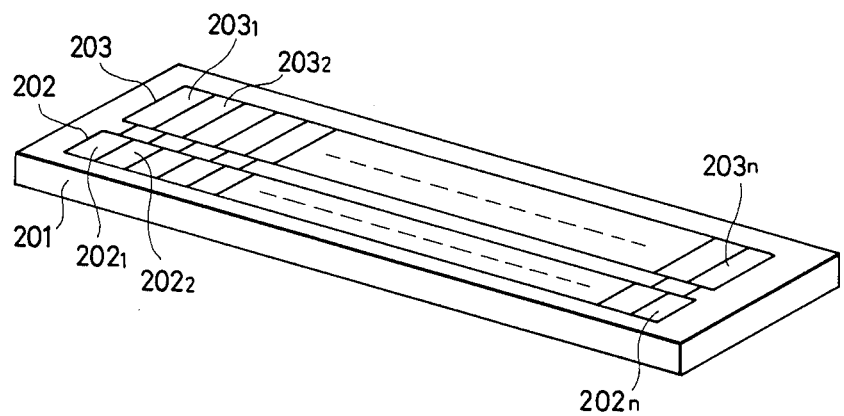
FIG. 6 is a schematic perspective view of an image input photosensor according to an embodiment of the present invention.

FIG. 6 is a schematic perspective view of an image input photosensor according to an embodiment of the present invention.

Referring to FIG. 6, a single-crystal Si film is grown on a substrate 201 having an amorphous insulating material surface serving as a deposition surface. A photosensor unit array 202 and a scanning circuit array 203 are formed in the single-crystal Si layer. The photosensor unit array 202 comprises n photosensor units $202_1$ to $202_n$ each corresponding to one pixel. The scanning circuit array 203 comprises n scanning circuits $203_1$ to $203_n$. The scanning circuits $203_1$ to $203_n$ are arranged to respectively correspond to the photosensor units $202_1$ to $202_n$ and are electrically connected thereto.

Optical information is photoelectrically converted by the photosensor units $202_1$ to $202_n$ into electrical signals, and the electrical signals are transferred to the scanning circuits $203_1$ to $203_n$. The photosensor units $202_1$ to $202_n$ have a structure such as a type (MOS sensor) in which photocarriers generated by p-n junction photodiodes are stored in sources as main electrodes of MOS transistors, and a type in which photocarriers are stored in control electrodes (i.e., the bases of the bipolar transistors, gates of semiconductor-insulator transistors (SITs), or the gates of MOS transistors) and are amplified to read out information charges. The latter type in which the photocarriers are stored in the control electrodes has advantages such as a high output, a wide dynamic range, a high S/N ratio (i.e., low noise), and nondestructive read access. This embodiment exemplifies an image input photosensor (Japanese Unexamined Patent Publication No. 60-12759) having an photoelectric transducer element as a photosensor in which photocarriers are stored in a bipolar transistor electrode.

Figure 7A:
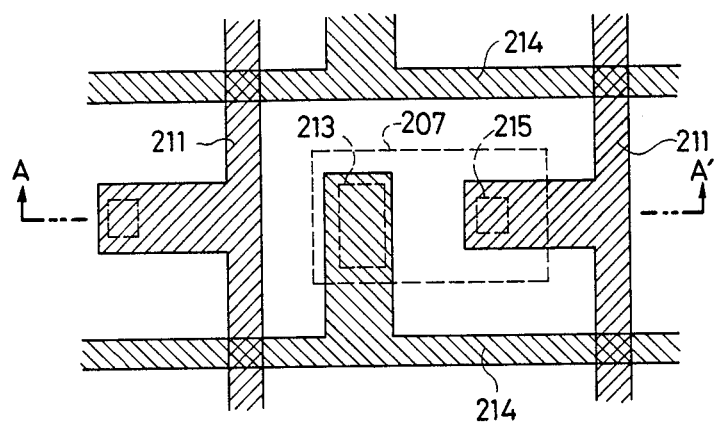
FIGS. 7A to 7C are views for explaining a photosensor unit in the image input photosensor shown in FIG. 6.
Figure 7B:
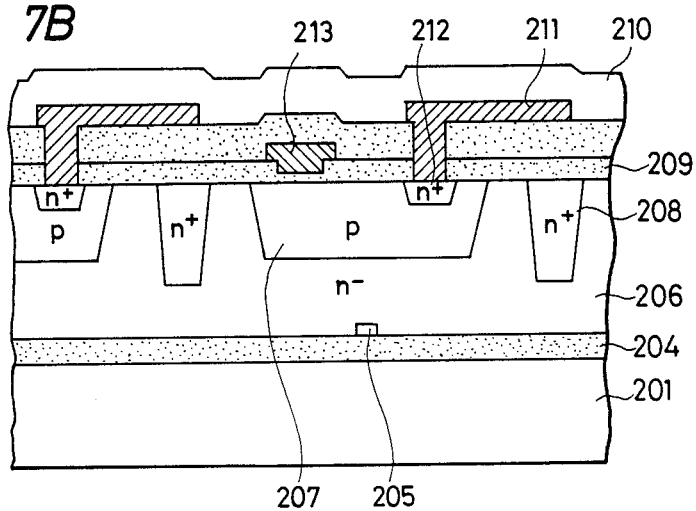

FIG. 7A is a schematic plan view of a photosensor unit of the above image input photosensor, FIG. 7B is a sectional view thereof taken along the line A-A' of FIG.

Figure 7C:
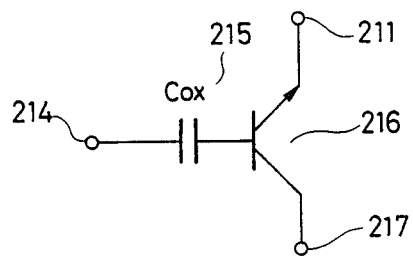

7A, and FIG. 7C is a circuit diagram showing an equivalent circuit of the photosensor unit.

As shown in FIGS. 7A and 7B, the photosensor cell has the following structure. A material film having a low nucleation density, e.g., an $SiO_2$ thin film 204, is formed on a substrate 201 consisting of a desired material. A material having a high nucleation density, e.g., a micropatterned $Si_3N_4$ thin film 205, is formed on the thin film 204. An $n^-$-type region 206 having a low concentration of a n-type impurity and made of a crystalline Si thin film is grown on the thin film 205. A p-type region 207 serving as the base of a bipolar transistor and an element isolation region 208 for electrically insulating adjacent photosensor cells are formed in the $n^-$-type region 206. An $n^+$-type region 212 serving as the emitter of the bipolar transistor is formed in the p-type region 207.

A method of forming a crystalline layer on the thin film 204 on the substrate 201 will be described in detail later.

The $n^+$-type region 212 is connected to a wiring layer 211 consisting of a conductive material such as Al, through a contact hole. A signal is externally read out through the wiring layer 211.

A capacitor electrode 213 is formed on the p-type region 207 through an insulating film 209. The capacitor electrode 213 is connected to a wiring layer 214. A potential at the p-type region 207 which is held in a floating state is controlled by the capacitor electrode 213. An electrode 217 (not shown) for applying a collector voltage to the bipolar transistor is connected to the element isolation region 208.

Each sensor cell is covered by a passivation film 210.

An operation of the image input photosensor having the structure as described above will be described with reference to the equivalent circuit diagram (FIG. 7C) of the image input photosensor.

The photosensor unit in the image input photosensor according to the present invention includes capacitor (Cox) 215 and a bipolar transistor 216, as shown in FIG. 7C. The capacitor (Cox) 215 has a MOS structure and comprises the electrode 213, the insulating film 209, and the p-type region 207. The bipolar transistor 216 comprises the $n^+$-type region 212 serving as the emitter, the p-type region 207 serving as the base, and the $n^-$-type region 206 serving as the collector.

The basic operations of the photosensor unit are storage, reading, and refreshing.

At first, the p-type region 207 at a negative potential is set in the floating state. Holes of the electron-hole pairs generated by light excitation are stored in the p-type region 207 (storage operation).

Subsequently, a positive read voltage pulse is supplied to the capacitor electrode 213 to increase the potential of the p-type region 207, thereby forward-biasing the emitter-base path. A stored voltage generated by the accumulated holes is read out to the $n^-$-type region 206 in the floating state (read operation).

The $n^-$-type region 206 is grounded, and a positive refresh voltage pulse is applied to the capacitor electrode 213. The holes stored in the p-type region 207 are discharged to the emitter side (refresh operation). When the stored holes are discharged, the positive refresh voltage pulse falls, and the p-type region 207 is set at the initial negative potential. Thereafter, the storage, read, and refresh operations are repeated.

Figure 8:
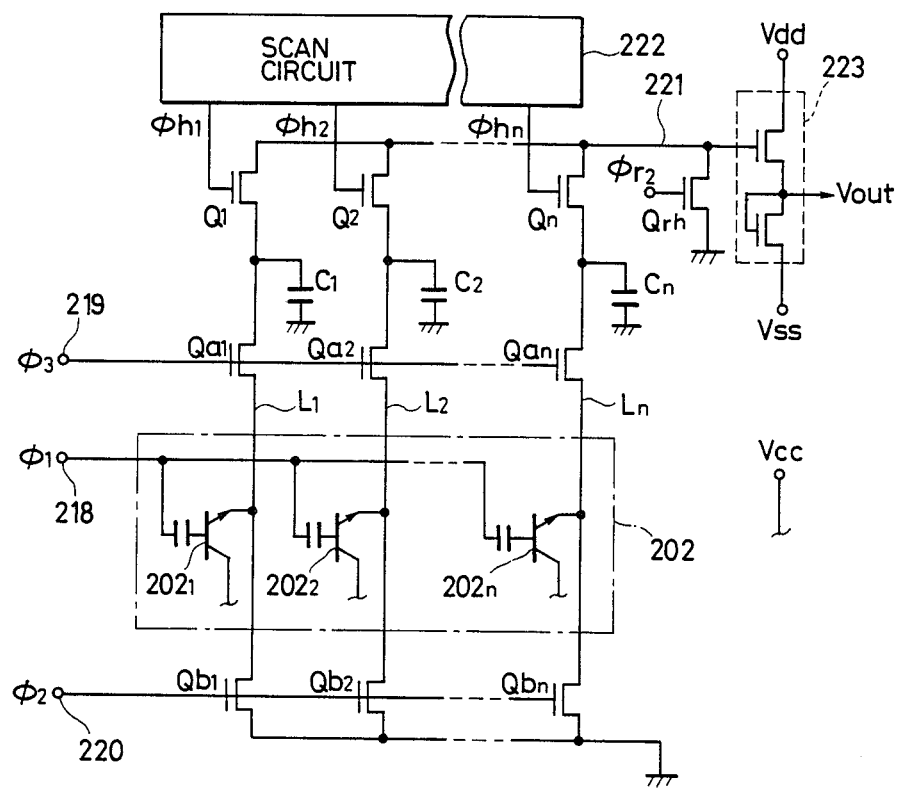
FIG. 8 is a circuit diagram of a scanning circuit in the image input photosensor using the photosensor unit shown in FIG. 7.

FIG. 8 is a circuit diagram of the scanning circuit in the image input photosensor using the photosensor unit described above.

Referring to FIG. 8, a predetermined positive voltage Vcc is applied to the collector electrodes of the photosensor units $202_1$ to $202_n$. The capacitor electrodes 213 are commonly connected to the wiring layer 214. A terminal 218 connected to the wiring layer 214 receives a pulse $\phi 1$ for performing the read and refresh operations. The emitter electrodes are respectively connected to vertical lines L1 to Ln, and the vertical lines L1 to Ln are connected to storage capacitors C1 to Cn through transistors Qa1 to Qan, respectively. The gate electrodes of the transistors Qa1 to Qan are commonly connected to a terminal 219. A pulse $\phi 3$ is input to the terminal 219.

The capacitors C1 to Cn are connected to an output line 221 through corresponding transistors Q1 to Qn. The gate electrodes of the transistors Q1 to Qn are connected to parallel output terminals of a scanning circuit 222. Pulses $\phi h1$ to $\phi hn$ are sequentially output from the parallel output terminals.

The output line 221 is grounded through a refresh transistor Qrh. A pulse $\phi r2$ is applied to the gate electrode of the transistor Qrh.

The vertical lines L1 to Ln are grounded through transistors Qb1 to Qbn, respectively. The gate electrodes of the transistors are commonly connected to a terminal 220. The terminal 220 receives the pulse $\phi 2$.

Figure 9:
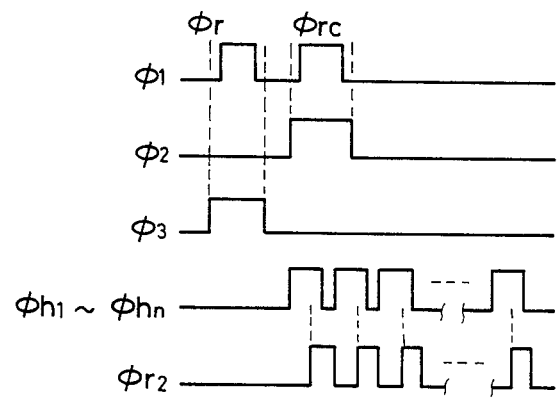
FIG. 9 is a timing chart for explaining the operation of the image input photosensor shown in FIG. 6.

FIG. 9 is a timing chart for explaining the operation of the image input photosensor.

Assume that carriers corresponding to incident light amounts are stored in photosensor units $202_1$ 1 to $202_n$. In this state, the transistors Qa1 to Qan are turned on in response to the pulse $\phi 3$, and the transistors Qb1 to Qbn are kept off in response to the pulse $\phi 2$ to set the emitter electrodes in the floating state. The positive read pulse $\phi r$ is applied to the terminal 218. Output signals from the cells are read out to the emitter side in the floating state and are respectively stored in the capacitors C1 to Cn. When the read operation is completed, the transistors Qa1 to Qan are turned off in response to the pulse $\phi 3$.

Subsequently, the transistors Qb1 to Qbn are turned on in response to the pulse $\phi 2$, and the emitter electrodes of the photosensor units are grounded. A pulse $\phi rc$ is supplied to the terminal 218, thereby performing the refresh operation. Holes stored in the base regions disappear. When the refresh operation is completed, the cells start storage.

When the refresh operation is started, the scanning circuit 222 outputs pulses $\phi h$ to $\phi hn$ to sequentially turn on the transistors Q1 to Qn. The signals stored in the capacitors C1 to Cn are sequentially output to the output line 221 and externally appear as an output signal Vout through an amplifier 223.

Every time the signal is output, the pulse $\phi r2$ is supplied at the same timings as the pulses $\phi h1$ to $\phi hn$. The transistor Qrh is turned on every timing, and the residual carriers on the output line 221 are eliminated. At the same time, the residual carriers are sequentially removed from the capacitors C1 to Cn through the transistors Q1 to Qn.

When read signals from all the photosensor units $202_1$ to $202_n$ are output, the next read cycle is started, and the same operations as described above are performed.

According to this embodiment as described above, by utilizing a technique for selectively growing crystalline Si on the amorphous insulating substrate, the crystalline Si thin film is grown on the substrate 201 having an amorphous insulating material surface, and the photosensor unit array 202 and the scanning circuit array 203 are formed thereon, thereby increasing the carrier mobility to allow high-speed read access. The photocurrent is increased to increase an S/N ratio, thereby performing multi-gradation read access.

The method of growing a crystal such as an Si crystal on the deposition surface such as an amorphous insulating surface is disclosed in Japanese Unexamined Patent Publication No. 61-153273. This method will be described below.

A method of selectively forming a deposition film on a deposition surface will be described below. Selective deposition is a method of selectively forming a thin film on a substrate by utilizing factors for determining nucleus formation during the thin film formation process. These factors include surface energy, a deposition coefficient, an elimination coefficient, and a surface diffusion rate.

Figure 10A:
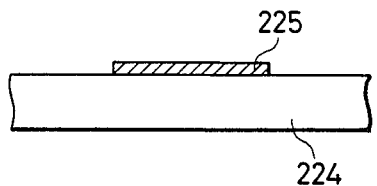
FIGS. 10A and 10B are views for explaining selective deposition.
Figure 10B:
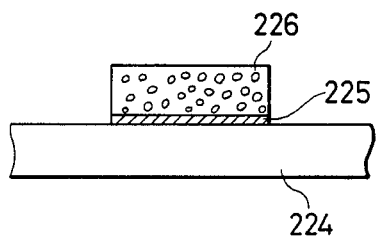

FIGS. 10A and 10B are views for explaining selective deposition. As shown in FIG. 10A, a thin film 225 is formed on a substrate 224 at a desired portion. The thin film 225 consists of a material having factors different from those of the substrate 224. When a thin film consisting of a proper material is deposited using proper deposition conditions, a thin film 226 is formed on only the thin film 225 but is not formed on other portions of the substrate 224. By utilizing this phenomenon, the thin film 226 can be grown in a self-aligned manner. Therefore, unlike the conventional technique, a photolithographic process using a resist can be omitted.

An example of the material for the substrate 224 in the selective deposition method described above is $SiO_2$, examples for the thin film 225 are Si, and GaAs, and examples for the thin film 226 are Si, W, GaAs, and InP.

Figure 11:
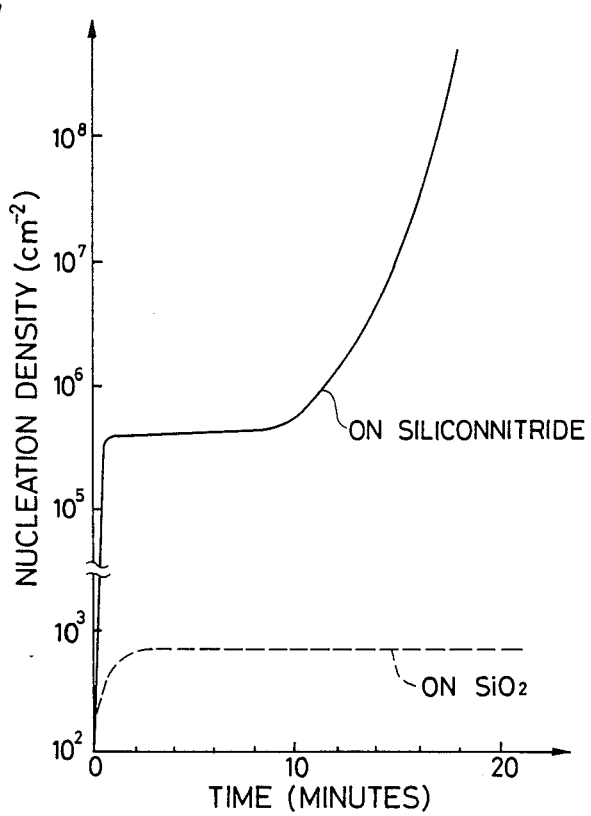
FIG. 11 is a graph showing changes in nucleation densities of a $SiO_2$ deposition surface and a silicon nitride deposition surface as functions of time.

FIG. 11 is a graph showing changes in the nucleation densities of the $SiO_2$ and silicon nitride deposition surfaces as a function of time.

As shown in the above graph, the nucleation density on the $SiO_2$ immediately after deposition is saturated to be $10^3$ cm$^{-2}$ or less and is not almost changed even after 20 minutes.

However, the nucleation density on silicon nitride ($Si_3N_4$) is temporarily saturated to be $4 \times 10^5$ cm$^{-2}$ and is not changed for another 10 minutes. However, the nucleation density is then abruptly increased. The results are obtained when $SiCl_4$ gas is diluted with $H_2$ gas and deposition is performed by CVD at a pressure of 175 Torr and a temperature of 1,000° C. The same results as described above can be obtained by using $SiH_4$, $SiH_2Cl_2$, $SiHCl_3$, or $SiF_4$ gas as a reaction gas and adjusting the pressure and the temperature. The same results as described above may be obtained by vacuum deposition.

In this case, nucleus formation on $SiO_2$ does not pose any problem. HCl gas is added to the reaction gas to further suppress nucleus formation on $SiO_2$. No Si is deposited on $SiO_2$.

The above phenomenon depends on differences between the adsorption coefficient, the elimination coefficient, and the surface diffusion coefficient of $SiO_2$ and those of silicon nitride with respect to Si. Si atoms themselves react to $SiO_2$ to produce silicon monoxide having a high vapor pressure. Silicon monoxide then etches $SiO_2$. However, the above reactions do not occur on silicon nitride, thereby achieving selective etching (T. Yonehara, S. Yoshioka, & S. Miyazawa, Journal of Applied Physics 53, 6839, 1982).

As described above, when $SiO_2$ and silicon nitride are selected as materials for the deposition surface, and silicon is selected as a deposition material, a large nucleation density difference shown in the above graph can be obtained. Although $SiO_2$ is preferable as a material for the deposition surface, the material is not limited to this. Any $SiO_x$ may be used if it provides a large nucleation density difference.

These materials are not limited to those described above. If materials having a nucleation density of 10 times or more and preferably $10^3$ times or more are used, selective deposition can be performed, as will be described later.

In order to obtain a large nucleation density difference, Si or N ions are locally injected in $SiO_2$ to form a region containing an excess amount of Si or N.

By utilizing this selective deposition method, a material different from that of the deposition surface and having a higher nucleation density than that of the deposition surface and a micropattern designed to allow growth of only a single nucleus, a single crystal can be selectively grown, centered on the single nucleus and consisting of the different material than that of the deposition surface.

Selective growth of a single crystal is determined by an electron state on the deposition surface, and in particular, the state of dangling bonds. The material (e.g., $SiO_2$) having a low nucleation density need not be a bulk material. This material may be formed on the surface of any material or a substrate to constitute the deposition surface.

A method of forming a single-crystal Si thin film having grain sizes corresponding to sizes of devices formed on a substrate will be described below.

Figure 12A:
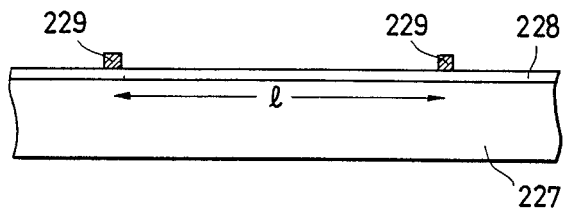
FIGS. 12A to 12D are sectional views for explaining steps in crystal formation.
Figure 12B:
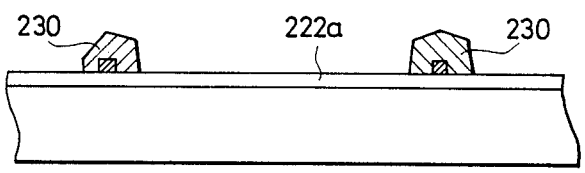
Figure 12C:
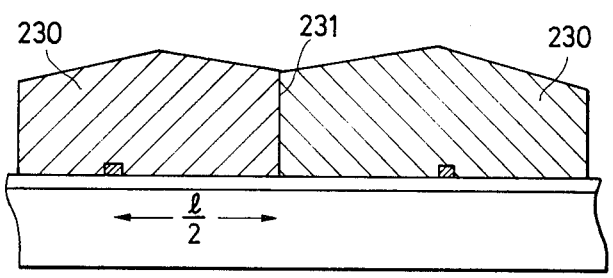
Figure 12D:
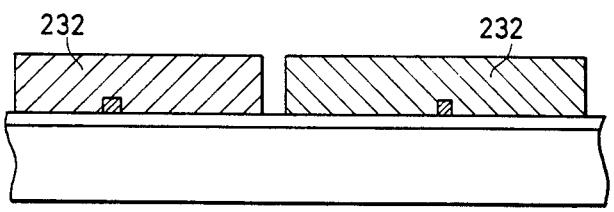
Figure 13A:
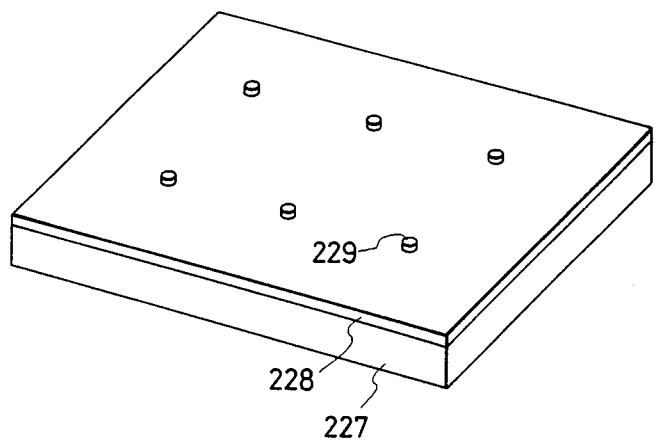
FIGS. 13A and 13B are perspective views of the substate states shown in FIGS. 12A and 12D, respectively.
Figure 13B:
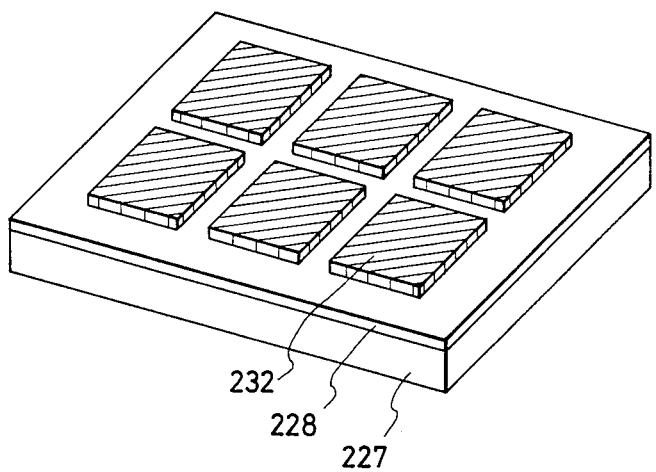

FIG. 12A to 12D are sectional views for explaining steps in forming a single crystal, and FIGS. 13A and 13B are perspective views corresponding to the sectional views of FIGS. 12A and 12D, respectively.

As shown in FIGS. 12A and 13A, a thin film 228 having a low nucleation density for allowing selective deposition is formed on a substrate 227. A material different from that of the thin film 228 and having a higher nucleation density than that thereof is formed and patterned by a photolithographic technique, thereby forming nucleus formation surface material micropatterns 229 spaced apart from each other by a distance 1.

Single nuclei consisting of a thin film material are respectively formed on only the nucleus formation surface material micropatterns 229 according to proper deposition conditions. More specifically, each micropattern 229 must have a sufficiently small size to allow growth of only a single nucleus. The size of the micropattern varies depending on the types of material but may be sufficiently several microns or less. Each nucleus grows while it maintains a single-crystal structure. Therefore, single-crystal islands 230 shown in FIG. 12B are formed. In order to form the single-crystal islands 230, the deposition conditions must be determined such that no nucleus formation occurs on the non-nucleus formation surface or the thin film 228.

The single-crystal islands 230 are further grown and are brought into contact with each other, as shown in FIG. 12C. Since the crystal orientations within the substrate surface are not constant, a grain boundary 231 is formed at the middle position between the adjacent nucleus formation surface material micropatterns 229. Subsequently, the single crystal islands 230 are three-dimensionally grown. Since the crystal surface having a low growth rate appears as a facet, the surface is smoothened by etching or polishing, and the grain boundary 231 is eliminated. The single-crystal thin-films 232 which do not contain the grain boundaries are formed in a matrix form, as shown in FIGS. 12D and 13B. The size of each single-crystal thin film 232 is determined by the distance l between the adjacent nucleus formation surface material micropatterns 229. In other words, by properly determining the formation pattern of the nucleus formation surface material micropatterns 229, the positions of the grain boundaries are controlled to arrange the single-crystal areas each having a desired size.

EXAMPLE

A method of forming a single-crystal layer in each embodiment described above will be described with reference to FIGS. 12A to 12D. An $SiO_2$ layer 228 is formed on a surface of a substrate 227 by sputtering, CVD, or vacuum deposition. The substrate 227 consists of any material such as a metal, a semiconductor, a magnetic material, a piezoelectric material, or an insulating material. Melted quartz, heat-resistant glass, alumina, or a ceramic material may be used without forming the $SiO_2$ layer 228.

A deposition surface material is preferably $SiO_2$. However, any $SiO_x$ may be used. A silicon nitride layer ($Si_3N_4$ layer) is formed on the $SiO_2$ layer 228 by low-pressure epitaxy. Alternatively, a polycrystalline silicon layer is formed as a layer containing a material different from that of a substrate, and a silicon oxide or silicon nitride layer may be patterned by a photolithographic technique using an electron or ion beam. The resultant micropatterns, i.e., the nucleus formation surface material micropatterns 229, have a size of several microns or less, and preferably less than one micron.

A gas mixture of HCl, $H_2$, and $SiH_2Cl_2$ (or $SiCl_4$, $SiHCl_3$, $SiF_4$, or $SiH_4$) is used to selectively grow silicon on the substrate 227. In this case, a substrate temperature is set at 700° to 1,100° C. and a pressure is about 100 Torr.

Single-crystal silicon islands 230 are grown, centered on the silicon nitride or polycrystalline silicon nucleus formation surface material micropatterns 229 within several tens of minutes. When optimal growth conditions are selected to obtain a size of several tens of microns or more.

Only Si is etched by reactive ion etching (RIE) with etching selectivity between Si and $SiO_2$ to obtain a flat surface, and the grain boundary 231 portions are removed to obtain single-crystal layer thin films 232. If the surface of the single crystal islands 230 are rough, mechanical polishing and then chemical etching are sequentially performed.

Composition of Silicon Nitride

In order to obtain a large nucleation density difference between the deposition surface material and a material different from the deposition surface material, $Si_3N_4$ need not be used. The composition of silicon nitride may be changed.

According to plasma CVD in which $SiH_4$ and $NH_3$ gases are decomposed in an RF plasma to form a silicon nitride film at a low temperature, an Si/N composition ratio in the silicon nitride film can be greatly changed by changing an $NH_3/SiH_4$ flow rate ratio.

Figure 14:
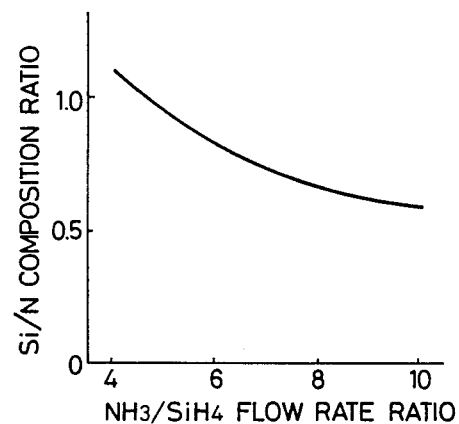
FIG. 14 is a graph showing the Si/N composition ratio as a function of the $NH_3/SiH_4$ flow rate ratio.

FIG. 14 is a graph showing the Si/N composition ratio as a function of the $NH_3/SiH_4$ flow rate ratio.

The above graph is plotted when an RF output is 175W, a substrate temperature is 380° C., and an $SiH_4$ gas flow rate is 300 cc/min, while an $NH_3$ gas flow rate is changed. As shown in FIG. 14, when the $NH_3/SiH_4$ gas flow rate is changed from 4 to 10, the Si/N composition ratio in the silicon nitride is changed from 1.1 to 0.58 according to Auger electrospectroscopy.

The composition of the silicon nitride film formed under the conditions that $SiH_2Cl_2$ and $NH_3$ gases were used at a low pressure of 0.3 Torr and a temperature of about 800° C. was similar to $Si_3N_4$ (Si/N = 0.75) as a stoichiometrical ratio.

A silicon nitride film prepared by heating Si in ammonia or $N_2$ at a temperature of about 1,200° C. (thermal nitrification) has a composition similar to a stoichiometrical ratio since film formation is performed in a thermal equilibrium state.

When the Si nucleus is grown by using silicon nitride as a deposition surface material having a higher Si nucleation density than that of $SiO_2$, a nucleation density difference occurs due to its composition ratio.

Figure 15:
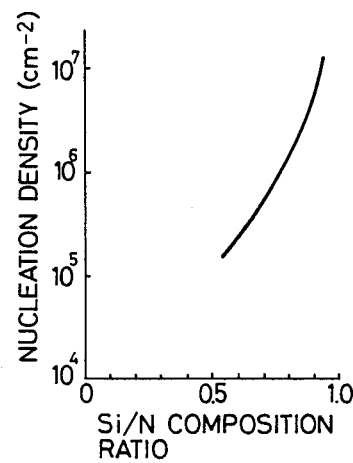
FIG. 15 is a graph showing the nucleation density as a function of the Si/N composition ratio.

FIG. 15 is a graph showing the relationship between the Si/N composition ratio and the nucleation density. As is apparent from this graph, when the composition of the silicon nitride film is changed, the Si nucleation density grown on the silicon nitride film is greatly changed. In this case, the nucleation conditions are given such that the pressure of $SiCl_4$ is reduced to 175 Torr and $SiCl_4$ is reacted with $H_2$ at 1,000° C., thereby producing Si.

The phenomenon in which the nucleation density is changed by the silicon nitride composition greatly influences the pattern size of silicon nitride as a material which is different from the deposition surface material and formed to be sufficiently fine enough to allow growth of only the single nucleus. That is, unless silicon nitride having a composition for a large nucleation density is finely patterned, a single nucleus cannot be formed.

The nucleation density and the optimal silicon nitride micropattern size for selecting the single nucleus must be selected. In deposition conditions for obtaining a nucleation density of, e.g., $\sim 10^5$ cm$^{-2}$ selection of a single nucleus is allowed by the silicon nitride size of 4 μm or less.

Formation of Material Different from that of Deposition Surface Material by Ion Implantation In order to obtain a large nucleation density difference for Si, Si, N, P, B, F, Ar, He, C, As, Ga, Ge ions or the like can be locally implanted or injected in the surface of the layer of $SiO_2$ as a deposition surface material having a low nucleation density to form a denatured region on the $SiO_2$ deposition surface. This denatured region may serve as a deposition surface material having a high nucleation density.

For example, a resist is formed on the surface of the $SiO_2$ layer and is exposed with a desired mask pattern, developed and dissolved to partially expose the surface of the $SiO_2$ layer.

Subsequently, SiF$_4$ gas is used as a source gas, and Si ions are implanted in SiO$_2$ at a dose of $1\times10^{16}$ $1\times10^{18}$ cm$^{-2}$ and an acceleration voltage of 10 keV. The projection range is 114 Å. The concentration of Si reaches $\sim 10^{22}$ cm$^{-3}$ on the surface of the SiO$_2$ layer. The region injected with ions is amorphous.

In order to form a denatured region, ions may be implanted using a resist as a mask. By using focused ion beam technique, a focused Si ion beam may impinge on the surface of the SiO$_2$ layer without using a resist mask.

After ion implantation is completed, the resist pattern is removed to form a denatured region containing an excessive amount of Si on the SiO$_2$ surface. Si is then apparently grown on the SiP$_2$ deposition surface having the denatured region.

Figure 16:
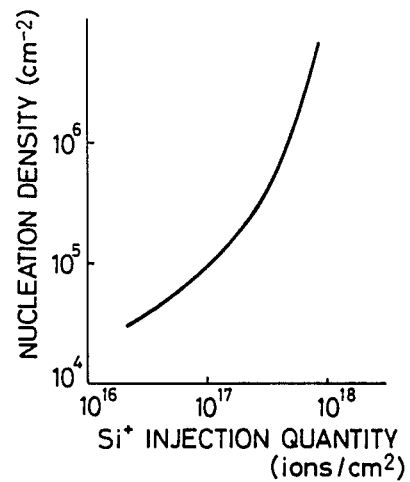
FIG. 16 is a graph showing the nucleation density as a function of $Si^{30}$ injection quantity.

FIG. 16 is a graph showing the injection quantity of Si ions and the nucleation density.

As is apparent from FIG. 16, when the injection quantity of Si$^+$ is increased, the nucleation density is increased accordingly.

By forming a sufficiently fine denatured region, the denatured region can serve as a material which is different from the deposition surface material and allows growth of a single nucleus. As a result, a single crystal can be grown as described above.

Formation of a sufficiently fine denatured region, i.e., micropatterning, can be achieved by a resist pattern or a focused ion beam spot.

Si Deposition Methods Excluding CVD

In addition to CVD for forming a single crystal by selective Si nucleus formation, another method can be utilized wherein Si is evaporated by an electron gun in a vacuum ($<10^{-6}$ Torr) and is deposited on a heated substrate. In particular, MBE (Molecular Beam Epitaxy) for depositing Si in a high vacuum ($<10^{-9}$ Torr), the Si ion beam is reacted with SiO$_2$ at a substrate temperature of 900° C. or higher, and no Si nucleus is formed on SiO$_2$ (T. Yonehara, S. Yoshioka, & S. Miyazawa, Journal of Applied Physics, 53, 10., P. 6839, 1982).

Single Si nuclei were preferably and selectively formed in silicon nitride micropatterns distributed on SiO$_2$ by utilizing the above phenomenon and single crystal Si was grown. In this case, the deposition conditions were as follows: the vacuum was $10^{-8}$ Torr or less; the Si beam intensity was $9.7\times10^{14}$ atoms/cm$^2$·sec; and the substrate temperature was 900° C. to 1,000° C.

In this case, a reaction product as SiO having a very high vapor pressure is formed by a reaction formula: SiO$_2$+Si→2SiO. SiO$_2$ itself is etched by Si by this evaporation.

However, no etching phenomenon occurs on silicon nitride, but nucleus formation and deposition occur.

In addition to silicon nitride as a deposition surface material having a high nucleation density, a tantalum oxide (Ta$_2$O$_5$), a silicon nitride oxide (SiON), or the like can be used to obtain the same effect as described above. These materials can be finely formed and serve as a material different from the deposition surface material, so that a single crystal can be grown using this different material as its center.

According to the image input photosensor as described above in detail, a crystalline semiconductor deposition film is formed on a deposition surface having a desired size, and the photosensor unit and the scanning circuit are formed on the deposition surface. Therefore, a multi-gradation, high-speed, high-resolution image input photosensor can be obtained. In addition, the photosensor unit and the scanning circuit can be formed on a substrate having a desired size and can be formed in an IC. Therefore, the image input photosensor according to this embodiment is less expensive than the multi-chip photosensor having a plurality IC sensor chips on an insulating material.

Figure 1:
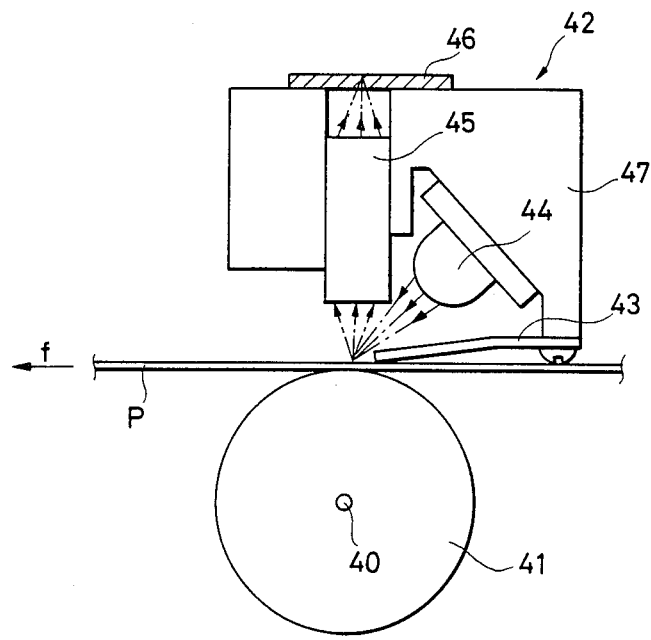
FIGS. 1 and 2 are schematic views showing conventional image reading apparatuses.
Figure 17A:
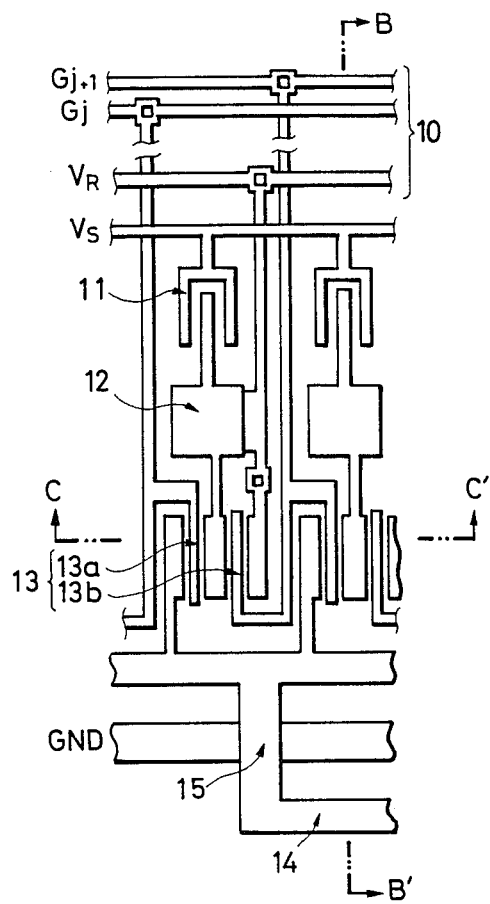
FIG. 17A and FIGS. 17B and 17C are a plan view of the image sensor according to another embodiment of the present invention, and sectional views taken along the lines B-B' and C-C' of FIG. 17A, respectively.
Figure 17B:
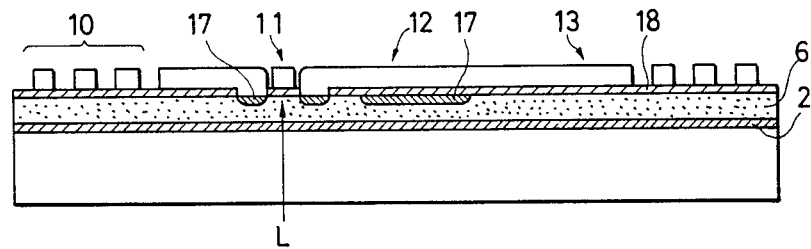
Figure 17C:
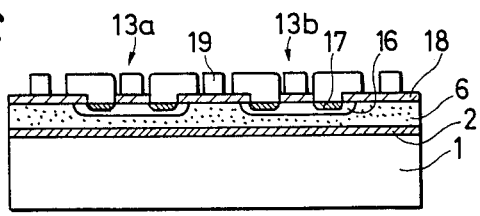

FIGS. 17A, 17B, and 17C show another embodiment of the present invention. More specifically, FIG. 17A is a plan view of an image sensor suitable for an image reading apparatus (FIG. 1) using a focusing optical system, and FIGS. 17B and 17C are sectional views thereof taken along the lines B-B' and C-C' of FIG. 17A, respectively.

Referring to FIGS. 17A to 17C, an image sensor includes matrix wiring patterns 10, photosensor units 11, charge storage units 12, switch units 13, a wiring line 14, and a load capacitor 15. Each switch unit 13 includes a transfer switch 13a and a discharge switch 13b for resetting the charge in the corresponding charge storage unit 12. The wiring line 14 transfers a signal output from the transfer switch 13a to a signal processing unit (to be described later). The load capacitor stores the charge transferred from the transfer switch 13a and reads the charge. For illustrative convenience, only upper and lower electrode wiring patterns are illustrated in FIG. 17A.

In this embodiment, the photosensor unit 11, the charge storage unit 12, the switch unit 13, and the necessary wiring patterns are formed on an insulating substrate in the single fabrication step.

An SiO$_2$ non-nucleus formation surface 2 is formed on an insulating underlying substrate 1, and an Si$_3$N$_4$ nucleus formation surface (not shown) is micropatterned such that single nuclei are formed, and a single-crystal Si thin film 6 is grown.

Boron (B) ions are doped to form p-type regions 16, and phosphorus (P) ions are doped to form n$^+$-type regions 17 for the photosensor unit 11, the charge storage unit 12, and the switch unit 13.

An insulating layer 18 is formed and Al 19 for electrode and wiring is patterned to a desired configuration.

In this embodiment, single-crystal Si thin film is used as a photoconductive semiconductor layer constituting the photosensor unit 11, the transfer switch 13a and the discharge switch 13b. Note that light L is received through the lower surface of the substrate 1.

Figure 2:
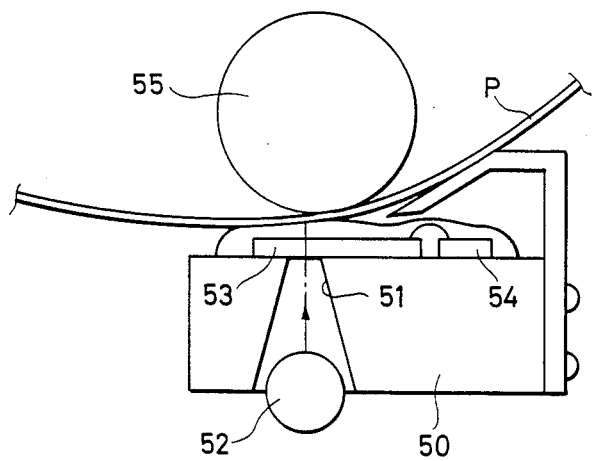
Figure 3:
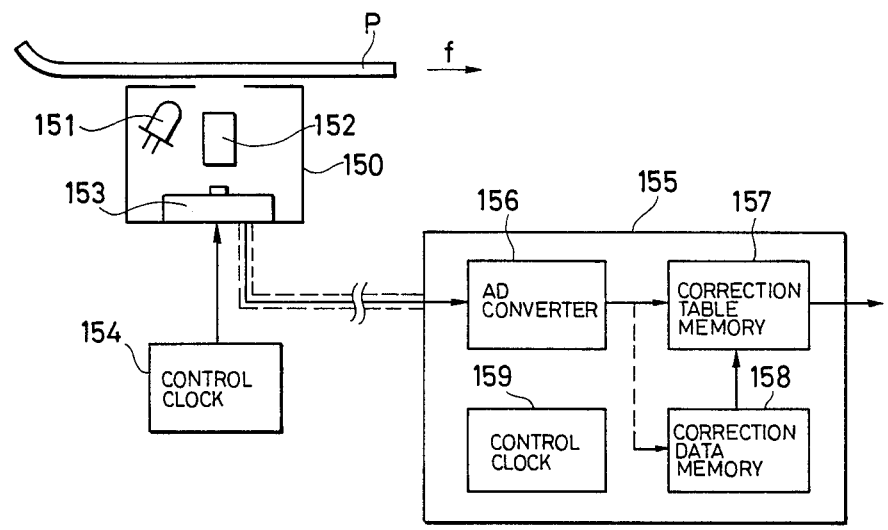
FIG. 3 is a schematic view showing still another conventional image reading apparatus.
Figure 4:
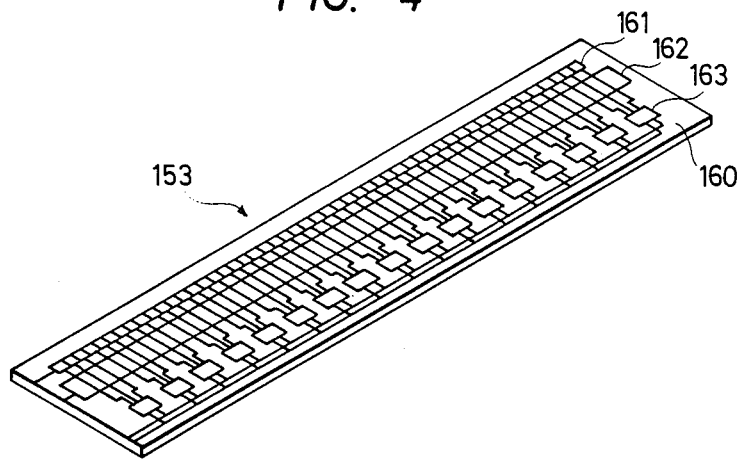
FIG. 4 is a schematic view showing a photoelectric transducer unit shown in FIG. 3.
Figure 5:
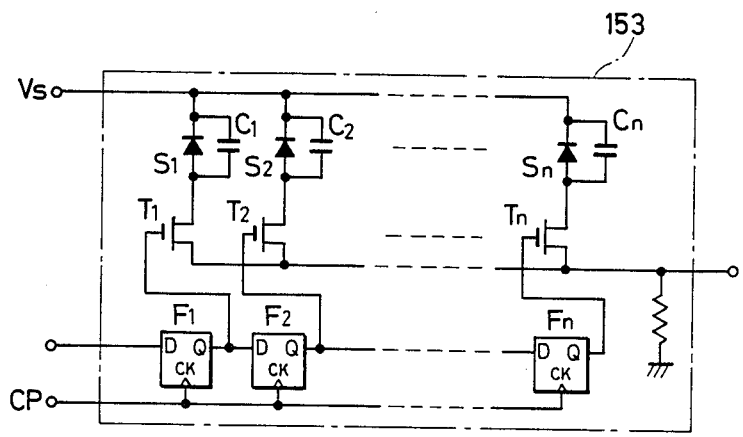
FIG. 5 is a circuit diagram showing an equivalent circuit of the arrangement in FIG. 4.
Figure 18A:
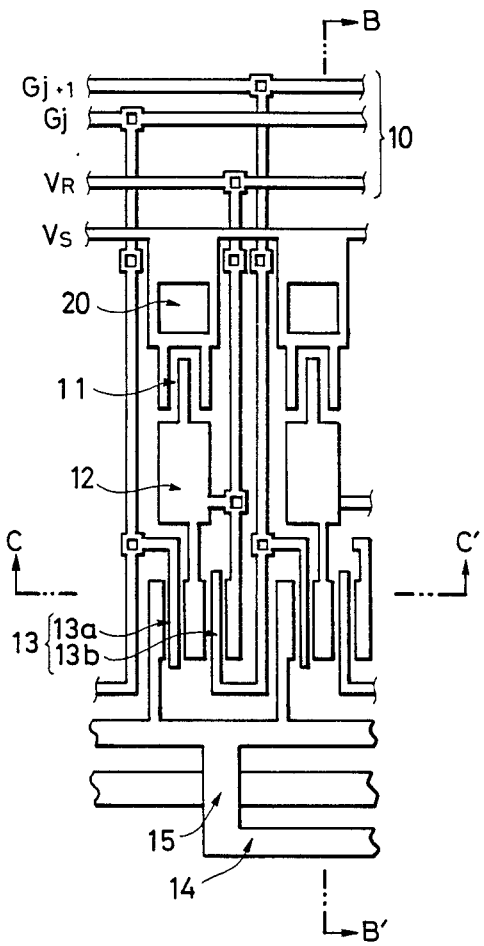
FIG. 18A and FIGS. 18B and 18C are a plan view of the image sensor according to still another embodiment of the present invention, and sectional views taken along the lines B-B' and C-C' of FIG. 18A, respectively.
Figure 18B:
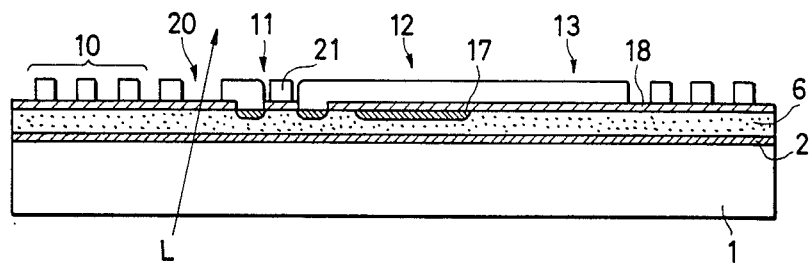
Figure 18C:
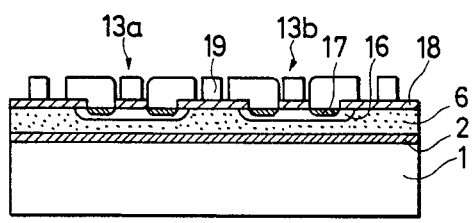

FIG. 18A, 18B, and 18C show still another embodiment of the present invention. FIG. 18A shows an image sensor suitable of the image reading apparatus (FIG. 2) without a focusing optical system, and FIGS. 18B and 18C are sectional views thereof taken along the lines B-B' and C-C' in the same manner as in FIGS. 17A, 17B, and 17C.

Referring to FIGS. 18A to 18C, the image sensor includes gate matrix wiring patterns 10, photosensor units 11, charge storage units 12, switch units 13, a wiring line 14, and a load capacitor 15. Each switch unit 13 comprises a transfer switch 13a and a discharge switch 13b for resetting the charge in the charge storage unit 12. The wiring line 14 transfers a signal output from the transfer switch 13a to a signal processing unit (to be described later). The load capacitor 15 stores the charge transferred from the transfer switch 13a and reads the charge. These components are formed in the multilayered structure as in FIGS. 17A to 17C.

Since light L is received through the lower surface of the substrate 1 to the upper surface thereof, the image sensor has an incident window 20, and an auxiliary electrode 21 in the photosensor unit 11 consists of a transparent conductive material.

Figure 19:
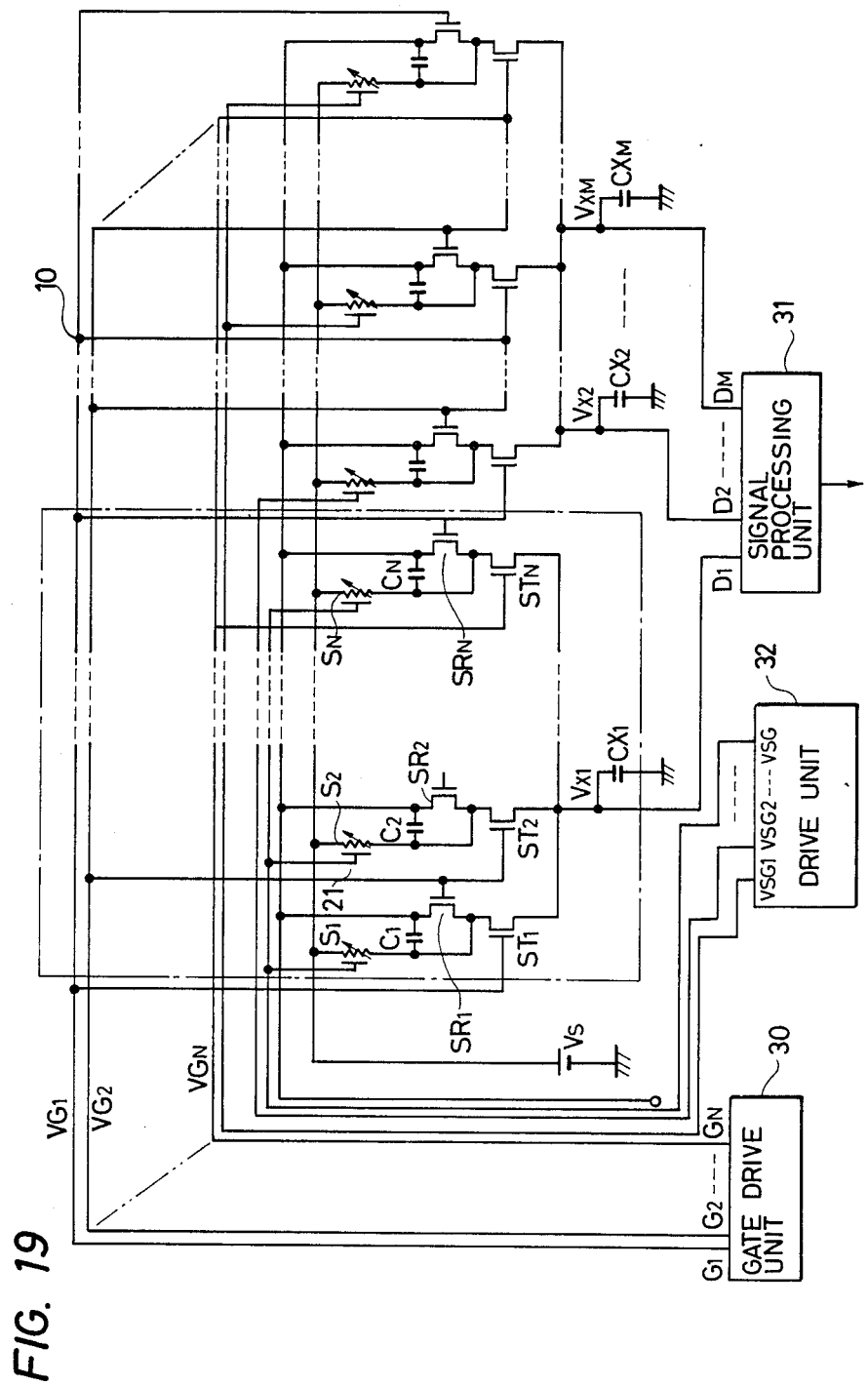
FIG. 19 is a circuit diagram of an equivalent circuit of each image sensor shown in FIGS. 17A to 18C.

FIG. 19 is a circuit diagram of an equivalent circuit of the image reading apparatus shown in FIGS. 17A to 17C or 18A to 18C.

Referring to FIG. 19, the photosensor unit 11 comprises photosensor elements S1, S2, . . . Sn (to be referred to as Sj hereinafter). The charge storage unit 12 comprises capacitors C1, C2, . . . CN (to be referred to as Cj hereinafter). Each storage capacitor Cj stores a photocurrent from the corresponding photosensor element Sj. Transfer switches ST1, ST2, . . . STN (to be referred to as STj hereinafter) (corresponding to the transfer switches 13a) transfer the charges of the storage capacitors Cj to a load capacitor CX1 (corresponding to the load capacitor 15). Discharge switches SR1, SR2, . . . SRN (to be referred to as SRj hereinafter) (corresponding to the discharge switches 13b) reset the charges of the storage capacitors Cj.

Each photosensor element Sj, and the corresponding storage capacitor Cj, the corresponding transfer switch STj, and the corresponding discharge switch SRj constitute each array. N arrays constitute one block, and N blocks constitute a total capacity of the image reading apparatus. For example, if 1728 sensor elements Sj are used, then N=32 and M=54. The gate electrodes of the transfer switches STj and the discharge switches SRj arranged in a two-dimensional array are connected to the wiring matrix unit 10. The gate electrodes of the transfer switches STj in one block are connected to the corresponding gate electrodes of the transfer switches STj of other blocks. The gate electrodes of the discharge switches SRj in a given block are cyclically connected to the gate electrodes of the next transfer switches STj of the next block.

The common lines (gate drive lines G1, G2, . . . GN) of the matrix wiring unit 10 are driven by a gate drive unit 30. Signal outputs are connected to a signal processing unit 31 through deriving lines 14 (signal output lines D1, D2, . . . DM).

The auxiliary electrodes 21 of the photosensor elements Sj are connected to a drive unit 32 in units of blocks and receive proper bias voltages VSG1, . . . VSG, thereby obtaining photocurrents having no distribution. A means for generating different bias voltages for the blocks may be a variable power source having volume controls in units of blocks, and these volume controls may be adjusted during the manufacture of the apparatus. Alternatively, a variable gain amplifier may be arranged and control values stored in a memory during initialization of the apparatus under the control of a controller having the memory are read out to control the amplifier.

With the above arrangement, the gate drive lines G1, G2, . . . GN sequentially receive the selection pulses VG1, VG2, . . . VGN from the gate drive unit 30. At first, when the gate drive line G1 is selected, the transfer switch ST1 is turned on, and the charge stored in the storage capacitor C1 is transferred to the load capacitor CX1. When the gate drive line G2 is then selected, the transfer switch ST2 is turned on, and the charge stored in the storage capacitor C2 is transferred to the load capacitor CX1. At the same time, the charge of the storage capacitor C1 is reset by the charge switch SR1. Similarly, the subsequent gate drive lines G3 to GN are sequentially selected and read operations are performed in the same manner as described above. These operations are performed in units of blocks. Signal outputs VX1, VX2, . . . VXM from the blocks are supplied to inputs D1, D2, . . . DM of the signal processing unit 31, respectively and are converted into a serial signal.

According to the embodiment described above, single-crystal thin films are selectively formed at desired positions on a long insulating substrate, and the photosensor unit, the charge storage unit, and the switch unit are formed on the thin films. Therefore, unlike a conventional image sensor, a high-speed, multi-gradation, high-resolution contact image sensor can be provided at low cost.

FIGS. 20A to 20E are views showing steps in manufacturing an image reading apparatus according to the present invention. More particularly, single-crystal semiconductor layers are formed on the substrate.

As shown in FIG. 20A, an insulating layer 305 having a lower nucleation density than that of a substrate 304 is formed on the substrate 304. A material different from that of the insulating layer 305 is formed to obtain a thin film. The thin film is patterned by photolithographic techniques to obtain nucleus formation surface micropatterns 306 spaced apart from each other by a distance l. The material, size, crystal structure, and composition of the substate 304 can be arbitrarily determined. Other functional elements may be formed on the substrate. Each nucleus formation surface micropattern 306 consisting of a material different from that of the insulating layer 305 includes a denatured region containing an excess amount of Si or N by ion-implanting Si or N into the insulating layer 305. In this embodiment, silicon is used as a material for the substrate 304, and an amorphous silicon oxide thin film obtained by thermally oxidizing a silicon surface layer may be used as the insulating layer 305. The substrate 304 and the insulating layer 305 constitute a bulk substrate 301 according to the present invention.

Single nuclei consisting of a deposition material are respectively formed on only the nucleus formation surface micropatterns 306 consisting of a material different from that of the insulating layer 305. Each nucleus formation surface micropattern 306 must be sufficiently small to allow formation of only a single nucleus thereon. The size of the micropattern 306 varies depending on the types of material and is generally several microns or less. When deposition continues, the nucleus is grown while maintaining a single-crystal structure. As shown in FIG. 20B, the nuclei are grown as single-crystal islands 307. In order to form the single-crystal islands, a nucleation reaction must be inhibited on the surface of the insulating layer 305. In this embodiment, amorphous $Si_3N_4$ is used as a material different from the deposition surface material.

The single-crystal islands 307 continue to grow while maintaining a single-crystal structure and are centered on the nucleus formation surface micropattern 306. As shown in FIG. 20C, the adjacent islands 307 are brought into contact with each other. In this case, since the crystal orientations are not uniform on the substrate surface, crystal grain boundaries 314 are formed at the intermediate positions between the nucleus formation micropatterns 306.

The single-crystal islands 307 continue to grow three-dimensionally. The crystal surfaces having a low growth rate appear as facets. The surface is smoothened by chemical etching or mechanical polishing. Therefore, as shown in FIG. 20D, single-crystal semiconductor layers 308 having a predetermined size are connected through the grain boundaries 314. The size of each single-crystal semiconductor layer 308 is determined by the distance l between the nucleus formation surface micropatterns 306. By properly determining the nucleus formation micropatterns 306, the single-crystal semiconductor layers 308 each having a desired size can be arranged in a desired shape. FIG. 20E is a plan view showing the structure in FIG. 20D.

According to the present invention, in addition to the substrate described above, the substrate 301 may be a substrate having a layer of an insulating material such as $SiO_2$ or silicon nitride. When the insulating layer 305 serving as the deposition surface (non-nucleus formation surface) is formed on the substate 304, the material of the substrate 304 serving as a support can be arbitrarily determined. The substrate 304 may have functional elements thereon. Each single-crystal semiconductor layer 308 can be formed on such a substrate.

In this embodiment, the non-nuclear formation surface 305 is a thin film of silicon oxide. However, an insulating material (e.g., glass, quartz glass, or a ceramic material such as alumina) which has a low nucleation density for allowing selective nucleus formation can be used as the substrate 301. Single-crystal semiconductor layers 308 may be formed on such a substrate in the same manner as described above.

Figure 21A:
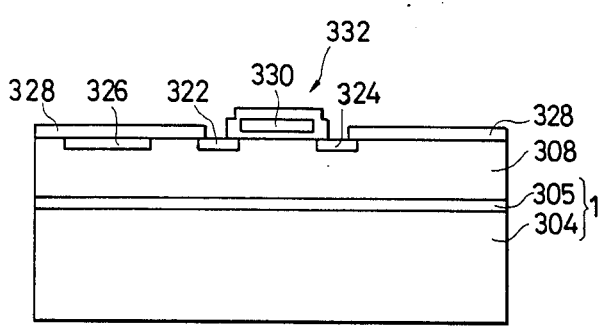
Figure 21B:
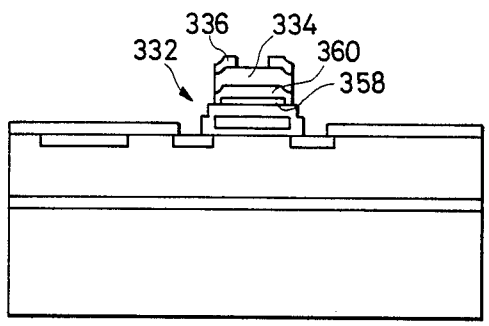
Figure 21C:
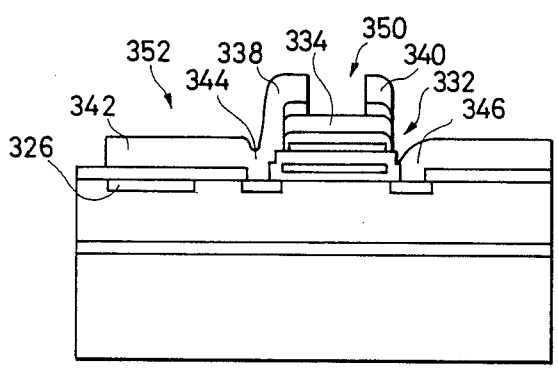
Figure 21D:
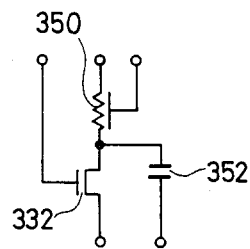

FIGS. 21A to 21C are views showing steps in manufacturing an image reading apparatus according to the present invention. More specifically, the single-crystal semiconductor layers 308 prepared as described above are subjected to impurity diffusion, formation of a thermal oxide film, photolithography, and thin-film deposition, all of which are performed in the conventional wafer processes, thereby forming the sensor unit and the signal transfer unit. FIG. 21D is a circuit diagram showing an equivalent circuit of the image reading apparatus shown in FIGS. 21A to 21C.

As shown in FIG. 21A, each single-crystal semiconductor layer 308 is formed in the same manner as described above, and a p-type impurity (e.g., B doping using $B_2H_6$ gas) is doped to form the p-type single-crystal semiconductor layer 308. An n-type impurity (e.g., phosphorus or arsenic) is diffused in the single-crystal semiconductor layer 308 to form n+-type regions 322, 324, and 326. A thermal oxide film 328 is formed on the surface of the single-crystal semiconductor layer 308 and is etched to form contact holes at positions corresponding to the n+-type regions 322 and 324. A conductive layer 330 is formed on the oxide film 328, thereby preparing a MOS switching element 332 having the conductive layer 330 as the gate electrode, and the n+-type regions 322 and 324 as the source and drain regions.

As shown in FIG. 21B, a metal such as Al or Cr is formed by sputtering or deposition on the surface of the switching element 332 and is patterned in a desired shape to form an auxiliary electrode 358. An insulating layer 360 of plasma CVD-$Si_3N_4$, a photoconductive layer 334 of amorphous silicon, and an n+-type layer 336 are formed and patterned in a desired shape.

As shown in FIG. 21C, Al is deposited by sputtering and patterned in a desired shape to prepare electrode and wiring conductive patterns. The conductive patterns constitute a pair of the electrodes 338 and 340 at the portion of the photoconductive layer 334, an electrode 342 at the portion of the n+-type layer 326, and electrodes 344 and 346 at the switching element 332 serving as the signal transfer unit. A photoconductive type sensor unit 350 is formed and includes the pair of electrodes 338 and 340 and the photoconductive layer 334. The electrode 342, the thermal oxide film 328, and the n+-type layer 326 constitute a charge storage capacitor 352 in the signal transfer unit. FIG. 21D is a circuit diagram of a 1-bit equivalent circuit of the structure shown in FIG. 21C.

The auxiliary electrode 358 is arranged to generate a desired potential to perform proper reading. Image reading apparatuses using such auxiliary electrodes are described in Japanese Patent Application Nos. 61-237064, 61-237065, 61-237066, and 61-237067 filed by the assignee of the present invention.

In the apparatus described above, the electron mobility of the switching element is several hundreds $cm^2/V \cdot s$, which is 1,000 times the electron mobility (about 0.5 $cm^2/V \cdot s$) of a switching element formed by using amorphous silicon.

Figure 22A:
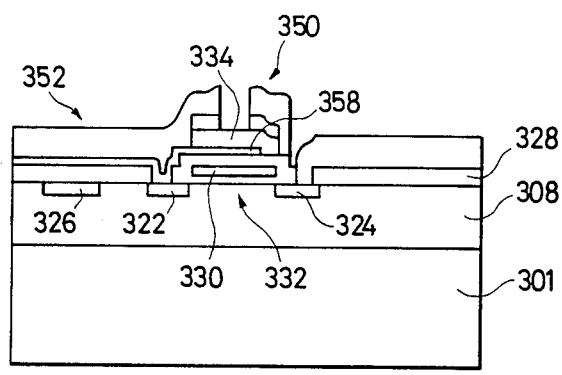
FIGS. 22 to 25B and FIGS. 27A and 27B are views showing an image reading apparatus according to still other embodiments of the present invention.
Figure 22B:
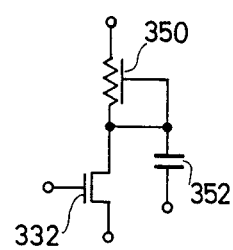

FIG. 22A shows still another embodiment of an image reading apparatus according to the present invention, and FIG. 22B is a circuit diagram showing an equivalent circuit of the image reading apparatus. The same reference numerals as in FIGS. 21A to 21D denote the same parts in FIGS. 22A to 22B.

In this embodiment, an auxiliary electrode 358 is set at the same potential as that of one of a drain region 322 of the switching element 332 and a charge storage capacitor 352.

Figure 23A:
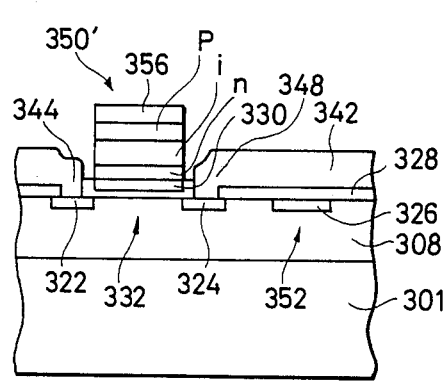
Figure 23B:
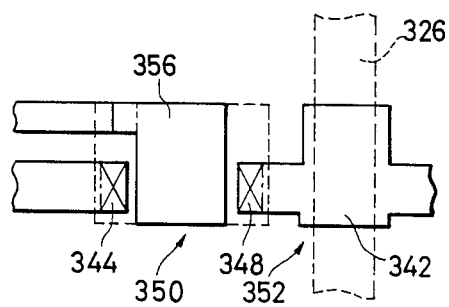

FIGS. 23A and 23B are a sectional view and a plan view, respectively, showing still another embodiment of an image reading apparatus according to the present invention. The same reference numerals as in FIGS. 21A to 21D denote the same parts in FIGS. 23A and 23B. In this embodiment, a sensor unit includes p-i-n diode sensor elements.

Referring to FIGS. 23A and 23B, a sensor unit 350' includes a p-type layer p, an i-type layer i, an n-type layer n, and a transparent electrode layer 356 consisting of ITO or $SiO_2$.

In this embodiment, one of the electrodes of the sensor element is directly connected to a gate electrode 330 of the MOS switching element 332. Therefore, the switching element 332 serves as an amplifier for the sensor signal.

In this embodiment, the sensor element comprises an p-i-n sensor element. Similarly, a Schottky or MIS sensor element may be used according to the conventional techniques known to those skilled in the art.

Figure 24A:
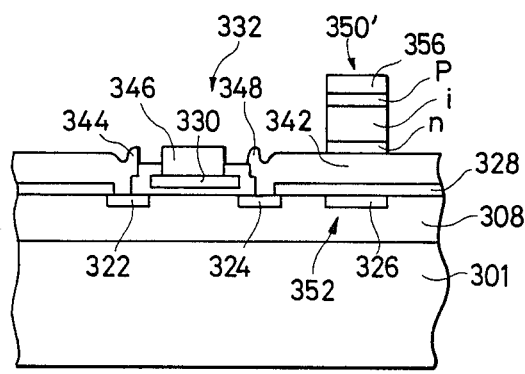
Figure 24B:
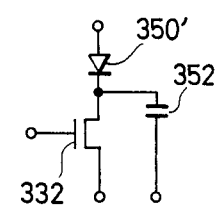

FIG. 24A is a view showing an image reading apparatus according to still another embodiment of the present invention, and FIG. 24B is a circuit diagram showing an equivalent circuit thereof. The same reference numerals as in FIGS. 23A to 23B denote the same parts in FIGS. 24A and 24B. In this embodiment, a sensor unit includes a p-i-n diode sensor element formed on a capacitor.

In this embodiment, an n-type layer side of the sensor is connected to one electrode 342 of a capacitor 352 and a drain electrode 348 of the switching element 332.

Figure 23C:
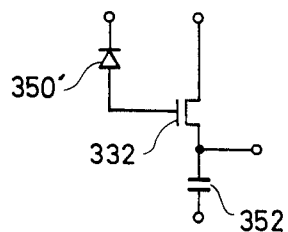

In the embodiments of FIGS. 23 to 24, the order of p-, i-, and n-type layers may be reversed depending on peripheral circuit arrangements.

Figure 25A:
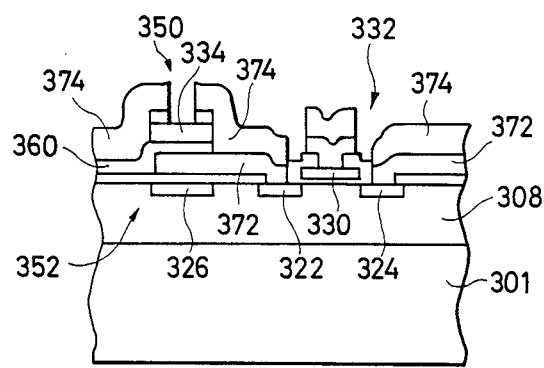
Figure 25B:
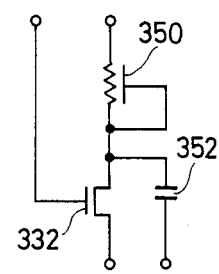

FIGS. 25A to 25B are views showing an image reading apparatus according to still another embodiment of the present invention. The same reference numerals as in FIGS. 22A and 22B denote the same parts in FIGS. 25A and 25B. In this embodiment, a sensor unit includes a photoconductive sensor element formed on a capacitor.

In this embodiment, a conductive layer 372 serves as one electrode of a capacitor 352 and an auxiliary electrode of a sensor unit 350. Conductive layers 374 serve as a pair of electrodes of the sensor unit 350. The conductive layers 372 and 374 are stacked in a switching element 332 to constitute its electrodes. As shown in FIG. 25A, one electrode of the sensor unit 350, the auxiliary electrode of the sensor unit, and one electrode of the capacitor 352 are connected to each other.

In the above embodiment, it is possible to use a photoconductive sensor without an auxiliary electrode. A CMOS or bipolar element may be used in place of the MOS element as the switching element.

Figure 26:
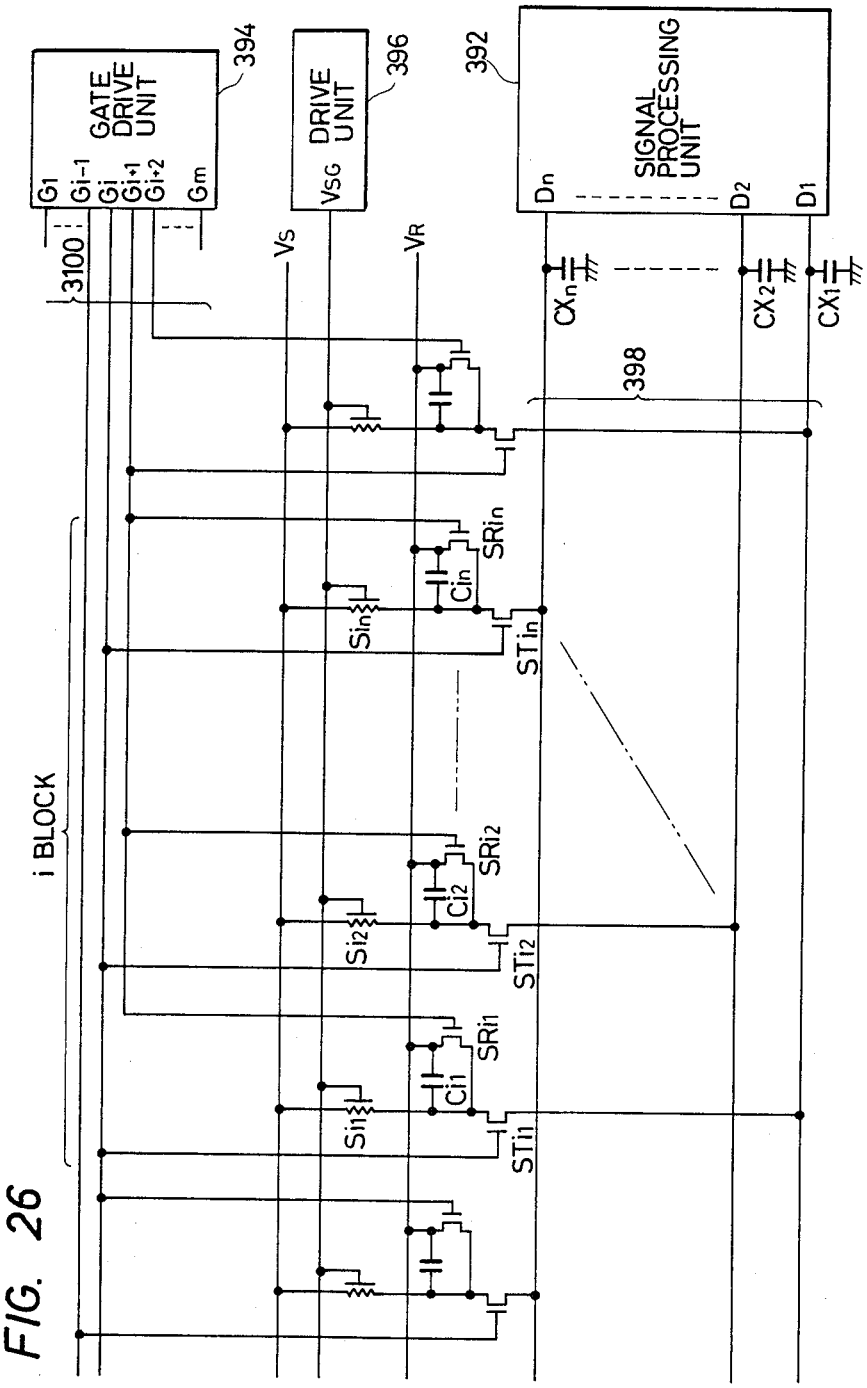
FIG. 26 is a circuit diagram of an equivalent circuit of the image reading apparatus according to the present invention.

FIG. 26 is a circuit diagram showing an equivalent circuit of the image reading apparatus shown in FIGS. 21A to 21D.

Referring to FIG. 26, the sensor unit 350 includes photosensor elements Si1, Si2, ... Sin (to be referred to as Si hereinafter; i is a block number and 1 to n are bits of each block), and the charge storage unit 352 includes charge storage capacitors Ci1, Ci2, ... Cin (to be referred to as Ci hereinafter). The charge storage capacitor Ci store photocurrents from the photosensor elements Si. The switching element 332 serving as transfer switch unit include transfer switches STi1, Sti2, ... STin (to be referred to as STi hereinafter) for transferring the charges of the charge storage capacitors Ci to load capacitors CX1, CX2, ... CXn and discharge switches SRi1, SRi2, ... SRin (to be referred to as SRi hereinafter) for resetting the charges of the charge storage capacitors Ci.

Each sensor element Si, the corresponding charge storage capacitor Ci, the corresponding transfer switch STi, and the corresponding discharge switch SRi constitute each array, n arrays constitute one block, and m blocks constitute a total capacity of the image reading apparatus. If 1728 sensors are used, then n=32 and m=54.

The gate electrodes of the transfer and discharge switches STi and SRi arranged in a two-dimensional array are connected to a gate wiring unit 3100. The gate electrodes of the transfer switches STi are commonly connected within the ith block. The gate electrodes of the discharge switches SRi in a given block are cyclically connected to the next gate electrodes of the transfer switches of the next block.

The common lines (e.g., gate drive lines G1, G2, ... Gm) of the matrix wiring unit 3100 are driven by a gate drive unit 394. Signal outputs are supplied to a signal processing unit 392 through matrixed deriving lines 398 (signal output lines D1, D2, ... Dn) in units of blocks. The auxiliary electrodes 358 of the photosensor elements S11, S12, ... S1n, S21, ... Smn are connected to a drive unit 396 and receive proper bias voltages.

Selection pulses (VG1, VG2, ... VGm) are sequentially supplied from the gate drive unit 394 to the gate drive lines G1, G2, ... Gm. When the gate drive line G1 is selected, the transfer switch ST1 is turned on and the charge stored in the charge storage capacitor C1 is transferred to the load capacitors CX1 to CXn. When the gate drive line G2 is selected, the transfer switch ST2 is turned on, and the charge stored in the storage capacitor C2 is transferred to the load capacitors CX1 to CXn. At the same time, the charge of the charge storage capacitor C1 is reset by the discharge switch SR1. The drive lines G3, G4, ... Gm are sequentially selected and read operations are performed. The operations are performed in units of blocks. Signal outputs VX1, VX2, ... VXm from the blocks are supplied to the inputs D1, D2, ... Dn of the signal processing unit 392, respectively, and are converted into a serial signal.

Figure 27A:
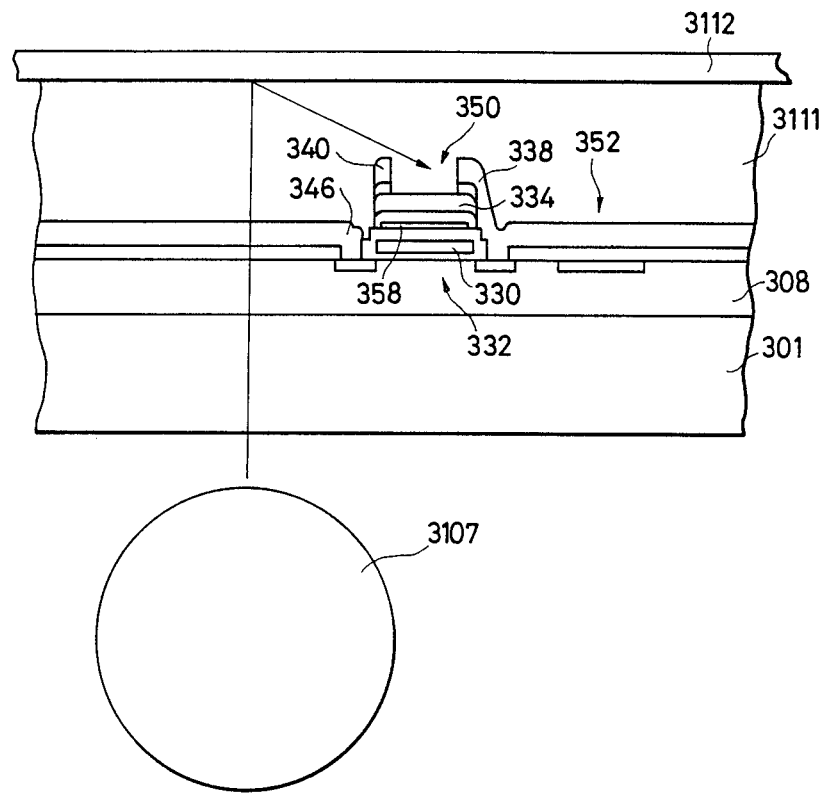
Figure 27B:
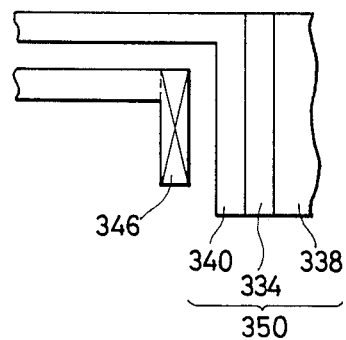

FIGS. 27A and 27B are views showing an image reading apparatus according still another embodiment of the present invention. The same reference numerals as in FIGS. 21A to 21D denote the same parts in FIGS. 27A and 27B.

In this embodiment, the arrangements of the sensor unit and the signal transfer unit are the same as those in FIGS. 21A to 21D. However, the layout of a light source and an original in FIGS. 27A and 27B are different from those in FIGS. 21A to 21E. More specifically, a light source 3107 is located on the substrate 301 side. A light beam from the light source 3107 is transmitted through the substrate 301 and a single-crystal semiconductor layer 308. The light beam is then transmitted through a transparent spacer 3111 which covers the sensor unit and the signal transfer unit. The light beam is then reflected by an original 3112 located in contact with the spacer and is incident on the photosensor unit 350, which thereby reads the original information.

The spacer 3111 is arranged to keep the gap between the photosensor unit 350 and the original 3112 and comprises a transparent member consisting of glass or quartz. The spacer may have a multilayered structure, a layer adjacent to the photosensor unit may be a passivation layer and a layer adjacent to the original 3112 is a wear-resistant layer.

In this embodiment, an auxiliary electrode 358 of the photosensor unit 350 and a gate electrode 330 of a switching element 332 prevent light from directly impinging from the light source 3107 on the photoconductive layer 334.

According to the embodiment described above, the sensor unit and the signal transfer unit are formed on a single substrate, and the signal transfer unit is made of a single-crystal semiconductor layer. Therefore, an image reading apparatus which has a high signal transfer capacity and a high read speed and can be easily mounted can be obtained. In addition, since the signal transfer unit comprises a single-crystal semiconductor layer, variations in transfer capacity can be minimized. Furthermore, a leakage current in the OFF state can be reduced and a high S/N ratio can be obtained, thereby preparing a multi-gradation image reading apparatus. The sensor unit is formed on the signal transfer unit, and a compact reading apparatus can be obtained.

FIGS. 28A to 28D are views showing steps in manufacturing the image reading apparatus according to the present invention. More specifically, the single-crystal semiconductor layers 408 prepared as described above are subjected to impurity diffusion, formation of a thermal oxide film, photolithography, and thin-film deposition, all of which are performed in the conventional wafer processes, thereby forming the sensor unit and the signal transfer unit.

Figure 28A:
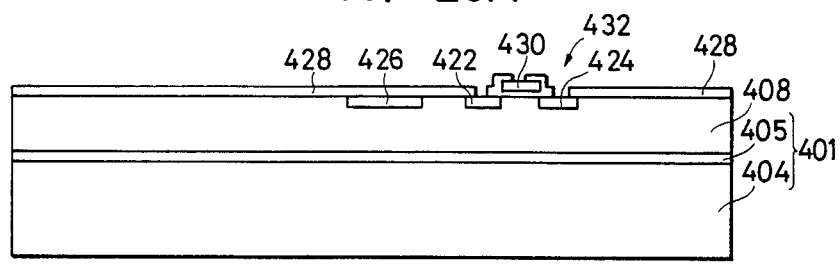
FIGS. 28A to 28D are views showing steps in manufacturing an image reading apparatus according to still another embodiment of the present invention.

As shown in FIG. 28A, each single-crystal semiconductor layer 408 is formed in the same manner as described above, and a p-type impurity (e.g., B doping using $B_2H_6$ gas) is doped to form the p-type single-crystal semiconductor layer 408. An n-type impurity (e.g., phosphorus or arsenic) is diffused in the single-crystal semiconductor layer 408 to form $n^+$-type regions 422, 424, and 426. A thermal oxide film 428 is formed on the surface of the single-crystal semiconductor layer 408 and is etched to form contact holes at positions corresponding to the $n^+$-type regions 422 and 424. A conductive layer 430 is formed on the oxide film 408, thereby preparing a MOS switching element 432 having the conductive layer 430 as the gate electrode, and the n+-type regions 422 and 424 as the source and drain regions.

Figure 28B:
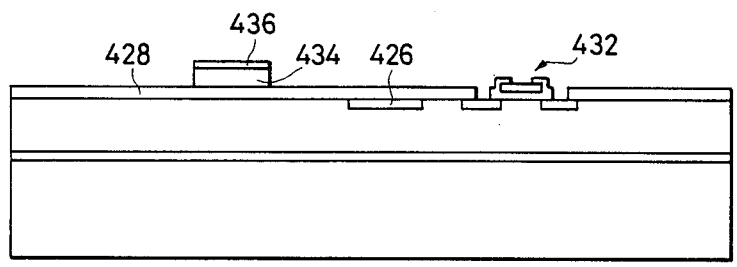

As shown in FIG. 28B, a photoconductive layer 434 of amorphous silicon formed by plasma CVD is formed on the thermal oxide film 428, and an ohmic-contact n+-type layer 436 is formed thereon.

Figure 28C:
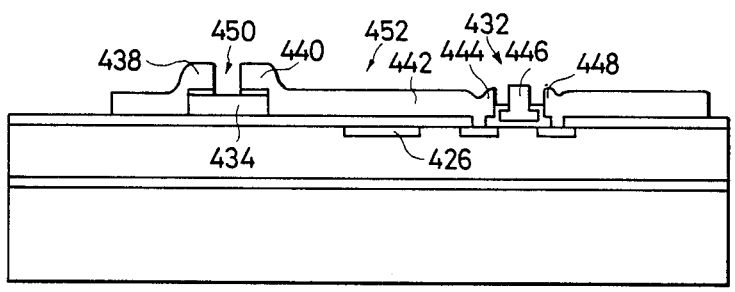
Figure 28D:
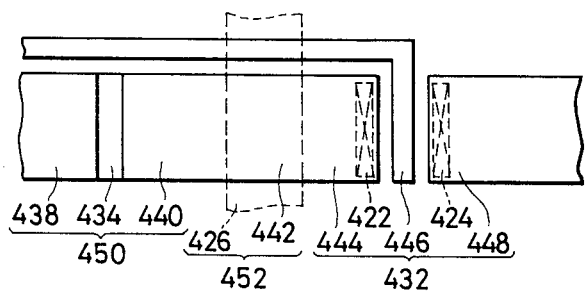

As shown in FIG. 28C, Al is formed by sputtering or deposition on the surface of the switching element 432 and is patterned in a desired shape to prepare electrode and wiring conductive patterns. The conductive patterns constitute a pair of electrodes 438 and 440 at the portion of the photoconductive layer 434, an electrode 442 at the portion of the n+-type layer 426, and electrodes 444, 446 and 448 at the signal transfer unit 432. A photoconductive type sensor unit 450 is formed and includes the pair of electrodes 438 and 440 and the photoconductive layer 434. The electrode 442, the thermal oxide film 428, and the n+-type layer 426 constitute a charge storage capacitor 452 in the signal transfer unit. FIG. 28D is a circuit diagram of a 1-bit equivalent circuit of the structure shown in FIG. 28C.

In the apparatus described above, the electron mobility of the switching element 432 is several hundreds cm$^2$/V·s, which is 1,000 times the electron mobility (about 0.5 cm$^2$/V·s) of a switching element formed by using amorphous silicon.

Figure 29:
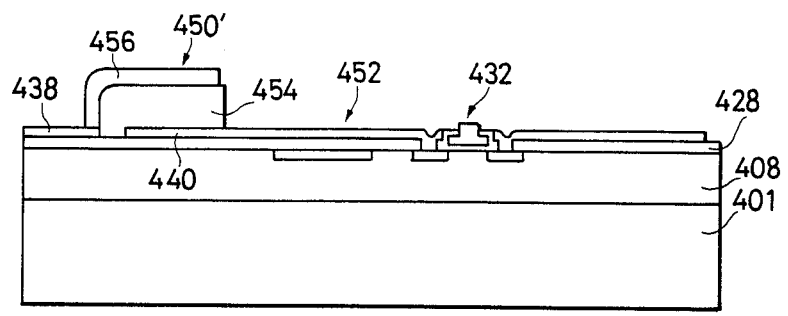
FIGS. 29 to 32 and FIG. 33 are views showing image reading apparatuses according to other embodiments of the present invention.

FIG. 29 is a view showing an image reading apparatus according to still another embodiment of the present invention. The same reference numerals as in FIGS. 28A to 28D denote the same parts in FIG. 29. A sensor unit in this embodiment includes a diode sensor element.

Referring to FIG. 29, a photoconductive transducer layer 454 is sandwiched between a transparent electrode layer 456 and an electrode 440. The transparent electrode layer 456 is connected to an electrode 438. The photoconductive transducer layer 454, the transparent electrode 456, and the electrode 438 constitute a sensor unit 450'.

In this embodiment, the sensor element is of a Schottky type. However, a p-i-n or MIS type sensor element may be used in place of the Schottky type sensor element according to conventional techniques known to those skilled in the art.

Figure 30:
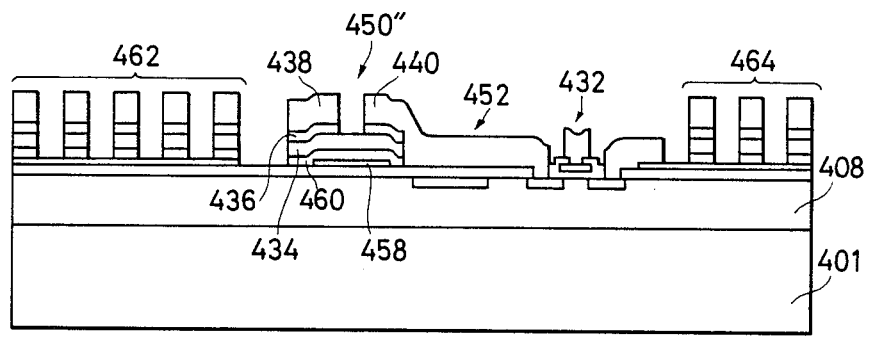

FIG. 30 is a view showing an image reading apparatus according to still another embodiment of the present invention. The same reference numerals as in FIG. 28 denote the same parts in FIG. 30. A photoconductive sensor element and an auxiliary electrode are used in a sensor unit in this embodiment.

A sensor unit 450'' include an auxiliary electrode 458 and an insulating layer 460. A wiring pattern 462 drives a switching element 432. A wiring pattern 464 is used to read a signal. These wiring patterns are arranged in a matrix form.

In this embodiment, the auxiliary electrode 458 generates a desired potential to properly read signal information. Conventional image reading apparatuses with such auxiliary electrodes are described in Japanese Patent Application Nos. 61-237064, 61-237065, 61-237066, and 61-237067 filed by the assignee of the present invention.

Figure 31:
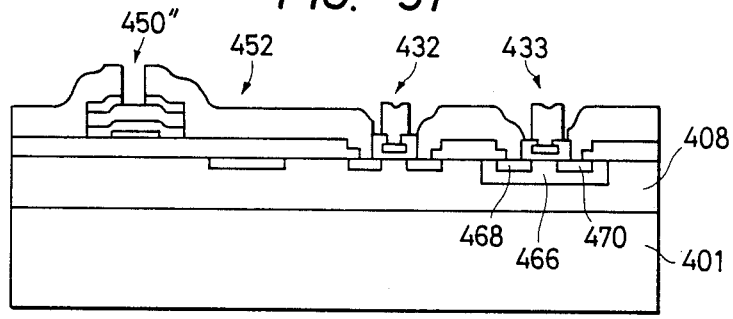

FIG. 31 is a view showing an image reading apparatus according to still another embodiment of the present invention. The same reference numerals as in FIG. 30 denote the same parts in FIG. 31. In this embodiment, a photoconductive sensor element and an auxiliary electrode are included in a sensor unit. In addition, a CMOS transistor is used as a switching element.

An n-channel MOS transistor 432 is the same as that in FIG. 30, and a p-channel MOS transistor 433 includes a phosphorus-doped n-type well region 466 and p+-type source and drain regions 468 and 470 prepared by boron diffusion.

Figure 32:
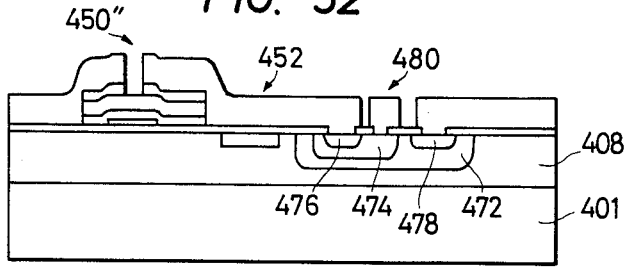

FIG. 32 is a view showing an image reading apparatus according to still another embodiment of the present invention. The same reference numerals as in FIG. 30 denote the same parts in FIG. 32. A photoconductive sensor element and an auxiliary electrode are included in a sensor unit. In addition, a bipolar transistor is used as a switching element.

Referring to FIG. 32, an n−-type region 472 is formed by phosphorus diffusion, and p+-type base region 474 is formed by boron diffusion. An n+-type emitter region 476 is formed by phosphorus diffusion, and an n-type collector region 478 is formed by phosphorus diffusion. The impurity concentration of the n-type collector region 478 is increased near an interface with the wiring pattern to obtain an n+-type portion. These regions are included to constitute a switching element 480.

Figure 33:
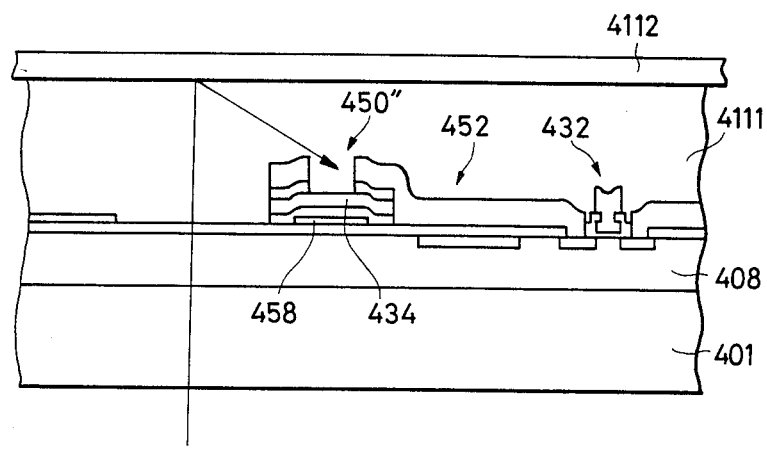

FIG. 33 is a view showing an image reading apparatus according to still another embodiment of the present invention. The same reference numerals as in FIG. 30 denote the same parts in FIG. 33.

In this embodiment, the arrangements of the sensor unit and the signal transfer unit are the same as those in FIG. 30. However, the layout of a light source and an original in FIG. 33 is different from those in FIG. 34. More specifically, a light source 4107 is located on the substrate 401 side. A light beam from the light source 4107 is transmitted through the substrate 401 and a single-crystal semiconductor layer 408. The light beam is then transmitted through a transparent spacer 4111 which covers the sensor unit and the signal transfer unit. The light beam is then reflected by an original 4112 located in contact with the spacer and is incident on the photosensor unit 450'', thereby reading original information.

The spacer 4111 is arranged to keep the gap between the photosensor unit 450'' and the original 4112 and comprises a transparent member consisting of glass or quartz. The spacer may have a multilayered structure, a layer adjacent to the photosensor unit may be a passivation layer and a layer adjacent to the original 4112 is a wear-resistant layer.

In this embodiment, an auxiliary electrode 458 of the photosensor unit 450'' and a gate electrode 430 of a switching element 432 prevent light from directly impinging from the light source 4107 onto the photoconductive layer 434.

According to the embodiment described above, the sensor unit and the signal transfer unit are formed on a single substrate, and the signal transfer unit is made of a single-crystal semiconductor layer. Therefore, an image reading apparatus which has a high signal transfer capacity and a high read speed and can be easily mounted can be obtained. In addition, since the signal transfer unit comprises a single-crystal semiconductor layer, variations in transfer capacity can be minimized. Furthermore, a leakage current in the OFF state can be reduced and a high S/N ratio can be obtained, thereby preparing a multi-gradation image reading apparatus.

Figure 34:
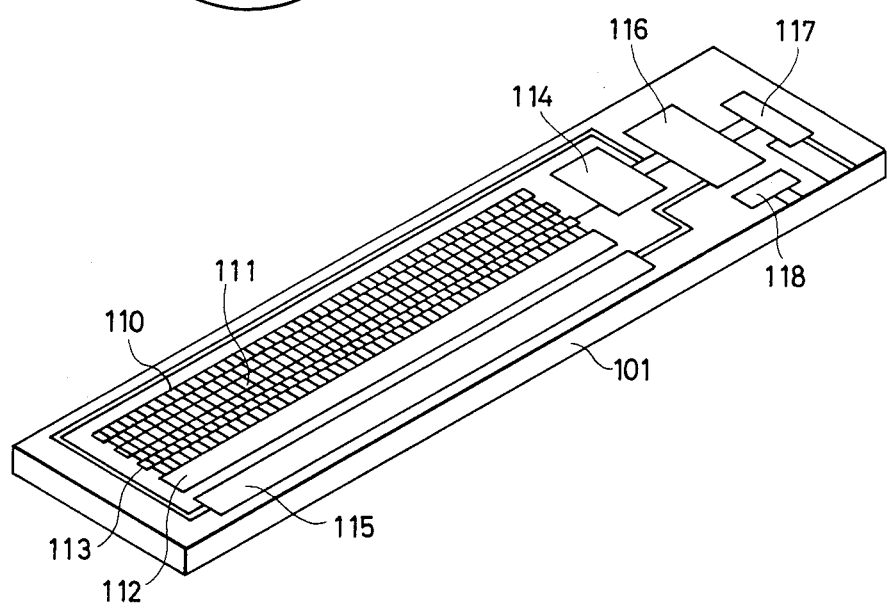
FIG. 34 is a schematic perspective view of a photoelectric transducer apparatus according to still another embodiment of the present invention.

FIG. 34 is a schematic perspective view of a photoelectric transducer apparatus according to the present invention. The photosensors prepared by the selective nucleus formation growth method and other electronic circuits are formed on a long insulating substrate 101.

A photosensor unit 110 for photoelectrically converting original image information, a storage capacitor unit 111 for storing the photoelectrically converted charges, a shift register 112, a transfer switch unit 113 controlled by the shift register 112 to transfer charges stored in the capacitor unit 111, an A/D converter 114, a correction data memory 115, a correction table memory 116, a $\gamma$ correction memory 117, and a clock generator 118 are formed on the substrate 101.

FIGS. 35A and 35B and FIGS. 36A and 36B are structures in which devices according to known semiconductor IC techniques are formed on single-crystal Si thin films 106 prepared by the selective nucleus formation growth method.

Figure 35A:
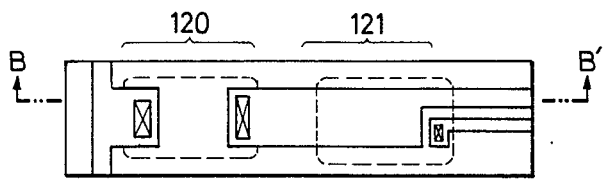
FIGS. 35A and 36A and FIGS. 35B and 36B are plan and sectional views of the photoelectric transducer apparatus shown in FIG. 34, respectively.
Figure 35B:
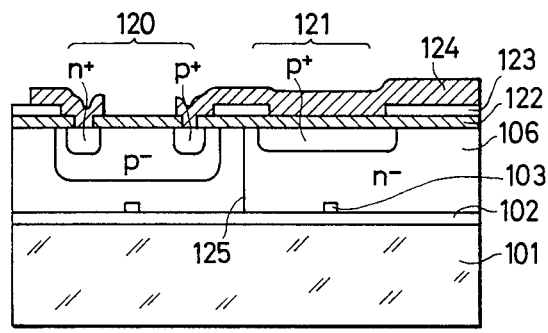

FIGS. 35A and 35B are a plan view of a photosensor constituted by a photodiode 120 and a storage capacitor 121, and a sectional view thereof taken along the line B-B' of FIG. 35A, respectively.

Referring to FIGS. 35A and 35B, a non-nucleus formation surface 102 having a low nucleation density and consisting of $SiO_2$ or the like is formed on an insulating substrate 101 consisting of glass, a ceramic material, or the like. On the nucleus formation surface 103 consisting of $Si_3N_4$ having a higher nucleation density, single crystal Si thin film 106 is formed. The photodiode 120 and the storage capacitor 121 are formed in the thin films 106 according to the conventional semiconductor IC techniques. The photosensor includes insulating layers 122 and 123 consisting of $SiO_2$ or $Si_3N_4$, a wiring pattern 124 consisting of aluminum or the like, and a crystal grain boundary 125.

Figure 36A:
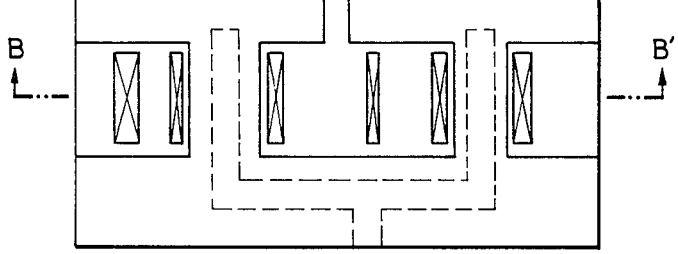
Figure 36B:
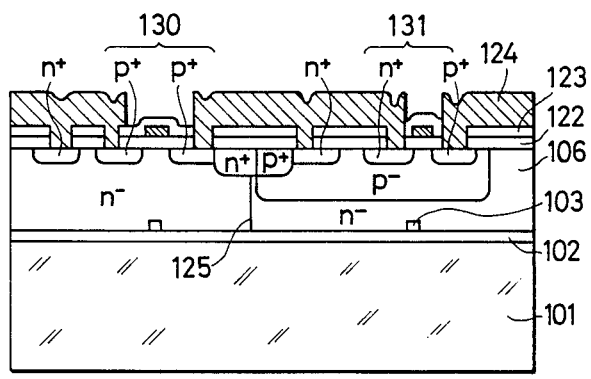

FIGS. 36A and 36B are a plan view of a CMOS inverter and a sectional view thereof taken along the line B-B' of FIG. 35A, respectively.

The CMOS inverter comprises a p-channel transistor 130 and an n-channel transistor 131.

The devices shown in FIGS. 35A to 36B constitute the photoelectric transducer apparatus shown in FIG. 34.

In the above embodiment, the photodiode and the transistors are formed by the conventional MOS process. However, all devices formed by the bipolar process and the process using silicon wafers can be used. In the above embodiment, the photodiode is used as a photosensor element. However, a photoconductive material such as amorphous silicon, CdS, or CdSe may be used to form the photosensor element.

Figure 37:
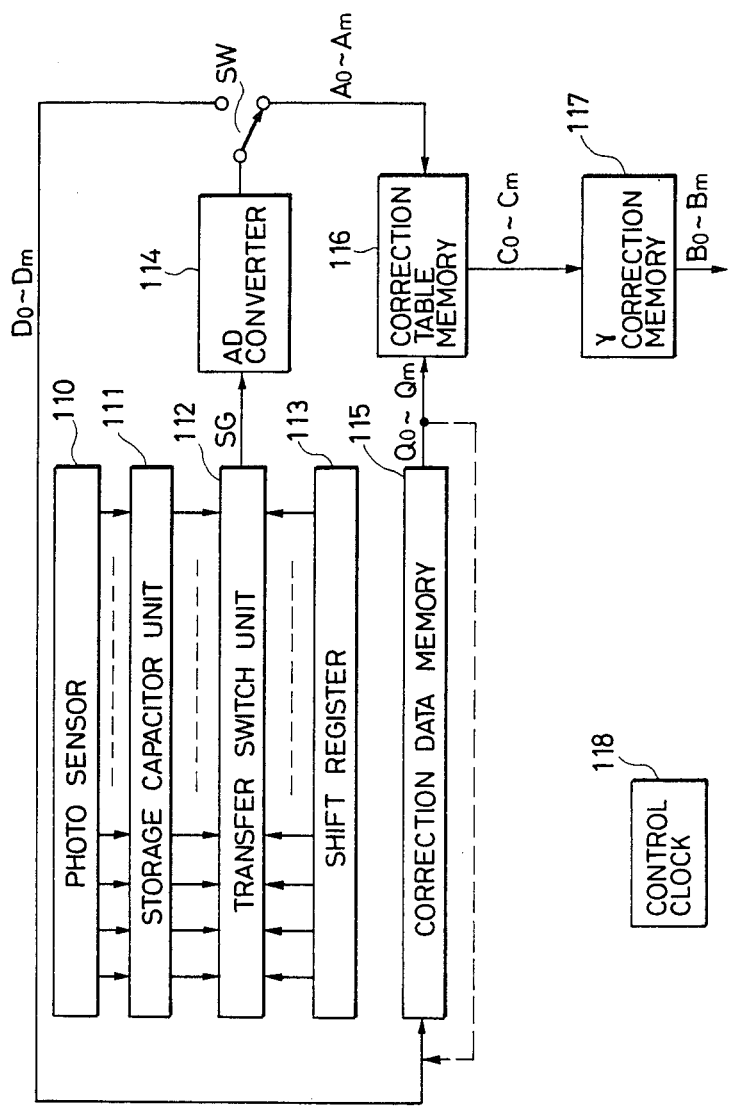
FIG. 37 is a block diagram of the photoelectric transducer apparatus shown in FIG. 34.
Figure 38:
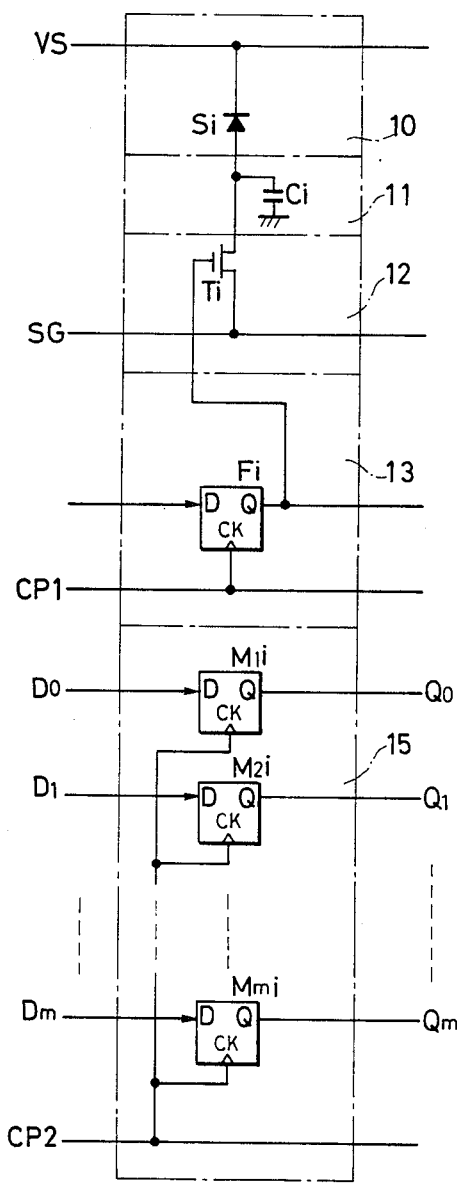
FIG. 38 is a circuit diagram of an equivalent circuit for one pixel in the apparatus shown in FIG. 34.

FIGS. 37 and 38 show an equivalent circuit of a one-pixel arrangement in the photoelectric transducer apparatus shown in FIG. 34.

Referring to FIGS. 37 and 38, image information of an original is photoelectrically converted by the photosensor unit 110 into a photocurrent. This photocurrent is stored as a charge in the storage capacitor unit 111. The stored charge is output through the transfer switch unit 112 driven by the shift register 113 and is input to the A/D converter 114.

The correction data memory 115 has two operation modes. One operation mode is to perform a reference value write operation for writing an output from the photosensor unit 110 which reads the reference white original. The other operation mode is to perform a reference value read operation for correcting variations of the photosensors during the actual image read operation.

Figure 39:
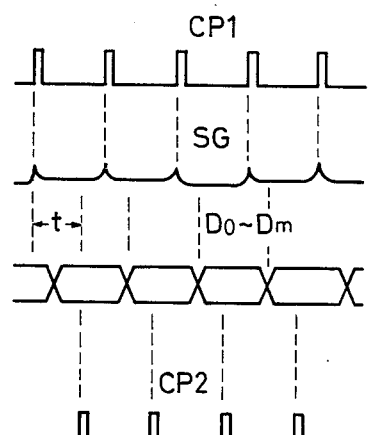
FIGS. 39 and 40 are timing charts for explaining the operation of the apparatus shown in FIG. 34.
Figure 40:
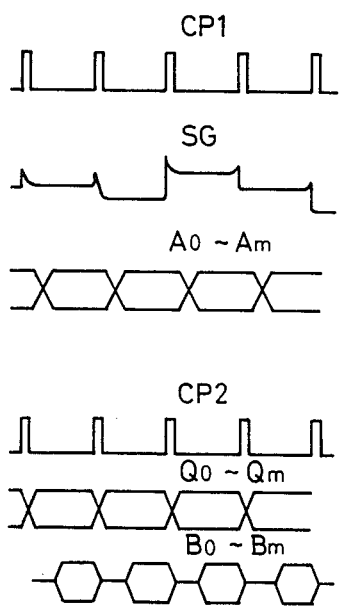

The timings of the reference value write and read operations are shown in FIGS. 39 and 40, respectively.

The reference value write operation will be described. Optical information of the reference white original or read portion is photoelectrically converted by the photosensor unit 110 and stored as charge in the storage capacitor unit 111. This charge is sequentially output as an output signal SG from the transfer switches T1 to Tn which are sequentially turned on in response to shift pulses CP1.

The output signal SG is input to the A/D converter 114, and its output is input as input signals D0 to Dm to the correction data memory 115 through a switch SW. When a time interval t has elapsed after conversion in the A/D converter 114, shift pulses CP2 are generated and the data during the reference white read operation is stored in the correction data memory 115 in response to these shift pulses.

The reference value read operation will be described below. The image information is output as a signal SG in response to the shift pulses CP1 and is converted by the A/D converter 114 into digital signals A0 to Am. The shift pulses CP2 are generated synchronously with the shift pulses CP1. The reference white data Q0 to Qm stored in the correction data memory 115 during the reference white read operation are read out from the correction data memory 115 so as to correspond to the pixels.

The signals A0 to Am and the data Q0 to Qm are input as an address signal to the correction table memory 116. The correction table memory 116 serves as a conversion table for performing the following operation:

$$\frac{A0 \cdot 2^0 + A1 \cdot 2^1 + A2 \cdot 2^2 + \ldots + Am \cdot 2^m}{Q0 \cdot 2^0 + Q1 \cdot 2^1 + Q2 \cdot 2^2 + \ldots + Qm \cdot 2^m} = C0 \cdot 2^0 + C1 \cdot 2^2 + \ldots Cm \cdot 2_m$$

By using the signals A0 to Am and the data Q0 to Qm as the address data, correction data C0 to Cm are output.

The resultant correction data C0 to Cm are output as an address signal to the $\gamma$ correction memory 117. The $\gamma$ correction memory 117 is used to correct of light amount dependency characteristics determined by the characteristics of the photosensor elements, and to improve the image by adjusting original density characteristics. The $\gamma$ correction memory 117 stores several conversion patterns which can be selectively used in accordance with the types of original.

In the above embodiment, the variation correction data memory comprises an RWM. However, an ultraviolet erasure type ROM, or a one-time ROM subjected to write access by fuse or diode breaking may be used in place of the RWM. In this case, when the substrate process is completed, the characteristics are measured to permanently write correction data in the correction data memory in accordance with variations.

As described above, when a photosensor unit, a transfer switch unit, a shift register, a correction memory, and the like are monolithically formed on a long substrate by utilizing the technique for selectively forming single-crystal silicon on an amorphous substrate, the following effects can be obtained.

(1) Since the amorphous substrate is used, the size of the substrate is not limited and a long substrate can be obtained.

(2) Since single-crystal silicon devices can be formed, the same performance as that of devices formed by the conventional single-crystal silicon wafer can be obtained. For this reason, unlike a polycrystalline or amorphous silicon sensor, a high-speed operation can be obtained (e.g., in a facsimile system, an A4-size original can be read in one or two seconds).

(3) Since the correction memory is built into the substrate and an operation equivalent to the operation for reading information from the photosensor element can be performed under clock control, the clock generator can be simplified.

(4) Since the correction memory comprises a ROM, data representing variations in sensitivity of the photosensor elements can be permanently stored. The photosensor elements and their variation data can be used on the same substrate, so that assembly control of apparatuses can be simplified.

(5) Since the A/D converter and each correction memory can be formed on a single substrate, a low-level analog signal does not leak outside the substrate. Therefore, the influence of external noise can be reduced to obtain a high S/N ratio.

(6) Since all the devices on the substrate can be formed by series of IC fabrication processes, high yield and low cost are achieved.

What is claimed is:

1. An image photosensor including a photosensor unit, a charge storage unit, and a switch unit, all of which are formed on a single-crystal semiconductor film grown from a single nucleus such that crystal formation is performed on a substrate having a free surface including a non-nucleus formation surface and a nucleus formation surface adjacent thereto, the non-nucleus formation surface having a low nucleation density, and the nucleus formation surface having a sufficiently small area to allow growth of only the single nucleus and having a higher nucleation density than that of the non-nucleus formation surface.

2. A photosensor according to claim 1, wherein light is incident on the photosensor unit from a lower surface of the substrate.

3. A photosensor according to claim 1, wherein light is incident on the photosensor unit from an upper surface of the substrate.

4. A photosensor according to claim 1, wherein light reflected by an object to be scanned is incident on the photosensor unit from a lower surface of the substrate.

5. A photosensor according to claim 1, wherein the single-crystal semiconductor film essentially consists of silicon.

6. A photosensor according to claim 2, wherein the single-crystal semiconductor film essentially consists of silicon.

7. A photosensor according claim 3, wherein the single-crystal semiconductor film essentially consists of silicon.

8. A photosensor according claim 4, wherein the single-crystal semiconductor film essentially consists of silicon.

9. An image reading apparatus including a set of a sensor unit and a transfer unit for transferring an output signal from the sensor unit, the sensor unit and the transfer unit being formed on a substrate whose at least surface portion has an insulating property, the signal transfer unit being formed so as to include a single-crystal semiconductor layer formed on a nucleus formation surface, the nucleus formation surface having a sufficiently small size and essentially consisting of a material different from that of the surface portion of the substrate, and the sensor unit being formed on the signal transfer unit.

10. An apparatus according to claim 9, wherein the signal transfer unit includes a switching element.

11. An apparatus according to claim 10, wherein the switching element is one of a MOS transistor, a CMOS transistor, and a bipolar transistor.

12. An apparatus according to claim 9, wherein the sensor unit is one of a photoconductive sensor and a diode sensor.

13. An image reading apparatus including a set of a sensor unit and a transfer unit for transferring an output signal from the sensor unit, the sensor unit and the transfer unit being formed on a substrate whose at least surface portion has an insulating property, the signal transfer unit being formed so as to include a single-crystal semiconductor layer formed on a nucleus formation surface on the insulating surface portion, the nucleus formation surface having a sufficiently small size and essentially consisting of a material different from that of the surface portion of the substrate.

14. An apparatus according to claim 13, wherein the signal transfer unit includes a switching element.

15. An apparatus according to claim 14, wherein the switching element is one of a MOS transistor, a CMOS transistor, and a bipolar transistor.

16. An apparatus according to claim 13, wherein the sensor unit is one of a photoconductive sensor and a diode sensor.

17. A photoelectric transducer apparatus including a photosensor unit, a transfer switch unit for time-serially outputting a signal from the photosensor unit, a drive unit for driving the transfer switch unit, and a correction memory for storing variation information of sensitivity in photosensor elements, all of which are formed on a single-crystal semiconductor film grown from a single nucleus such that crystal formation is performed on a substrate having a free surface including a non-nucleus formation surface and a nucleus formation surface adjacent thereto, the non-nucleus formation surface having a low nucleation density, and the nucleus formation surface having a sufficiently small area to allow growth of only the single nucleus and having a higher nucleation density than that of the non-nucleus formation surface.

18. An apparatus according to claim 17, wherein the correction memory comprises a read-only memory.

* * * * *

UNITED STATES PATENT AND TRADEMARK OFFICE
CERTIFICATE OF CORRECTION

PATENT NO. : 4,866,291

DATED : September 12, 1989

INVENTOR(S) : Tetsuya Shimada, et al.

It is certified that error appears in the above-identified patent and that said Letters Patent is hereby corrected as shown below: ON TITLE PAGE:

[57] ABSTRACT: line 1,

"unit" should read --unit,--.

COLUMN 1:

Line 50, "Assigner" should read --The assignee--.

COLUMN 4:

Line 18, "unit, and there" should read --unit. There--.

Line 24, "of" should read --of (1)--.

Line 25, "(1)" should be deleted.

Line 29, "enough" should be deleted.

Line 30, "(2)" should be deleted, and "growing" should read --(2) growing--.

COLUMN 5:

Line 48, "substate" should read --substrate--.

Line 55, "$Si^{30}$" should read --$Si^{+}$--

COLUMN 6:

Line 62, "an" should read --a--.

UNITED STATES PATENT AND TRADEMARK OFFICE
CERTIFICATE OF CORRECTION

PATENT NO. : 4,866,291
DATED : September 12, 1989
INVENTOR(S) : Tetsuya Shimada, et al.

It is certified that error appears in the above-identified patent and that said Letters Patent is hereby corrected as shown below:

COLUMN 7:

Line 40, "capacitor" should read --a capacitor--.

COLUMN 8:

Line 33, "$202_1$ 1" should read --$202_1$--.

COLUMN 10:

Line 40, "FIG. 12A to 12D" should read --FIGS. 12A to 12D--

COLUMN 11:

Line 5, "single crystal islands" should read --single-crystal islands--.

Line 9, "thin-films" should read --thin films--.

Line 52, "minutes. When" should read --minutes, when--.

COLUMN 13:

Line 2, "$1 \times 10^{16}$ $1 \times 10^{18}$" should read --$1 \times 10^{16}$ to $1 \times 10^{18}$--.

Line 14, "$SiP_2$" should read --$SiO_2$--.

UNITED STATES PATENT AND TRADEMARK OFFICE
CERTIFICATE OF CORRECTION

PATENT NO. : 4,866,291

DATED : September 12, 1989

INVENTOR(S) : Tetsuya Shimada, et al.

It is certified that error appears in the above-identified patent and that said Letters Patent is hereby corrected as shown below:

COLUMN 14:

Line 48, "FIG. 18A, 18B, and 18C" should read --FIGS. 18A, 18B, and 18C--.

Line 50, "image sensor suitable" should read --suitable image sensor--.

COLUMN 16:

Line 25, "substate 304" should read --substrate 304--.

Line 56, "micropattern 306" should read --micropatterns 306--.

COLUMN 18:

Line 45, "an" should read --a--.

COLUMN 20:

Line 5, "according" should read --according to--.

UNITED STATES PATENT AND TRADEMARK OFFICE
CERTIFICATE OF CORRECTION

PATENT NO. : 4,866,291

DATED : September 12, 1989

INVENTOR(S) : Tetsuya Shimada, et al.

It is certified that error appears in the above-identified patent and that said Letters Patent is hereby corrected as shown below:

COLUMN 21:

Line 53, "include" should read --includes--.

COLUMN 24:

Line 40, "$= C0 \cdot 2^0 + C1 \cdot 2^2 + \ldots Cm \cdot 2_m$" should read -- $= C0 \cdot 2^0 + C1 \cdot 2^2 + \ldots Cm \cdot 2^m$ --.

Line 47, "of" should be deleted.

COLUMN 25:

Line 29, "series" should read --a series--.

Line 59, "according" should read --according to--.

COLUMN 26:

Line 1, "according" should read --according to--.

UNITED STATES PATENT AND TRADEMARK OFFICE
CERTIFICATE OF CORRECTION

PATENT NO. : 4,866,291

DATED : Sept. 12, 1989

INVENTOR(S) : Tetsuya Shimada, et al

It is certified that error appears in the above-identified patent and that said Letters Patent is hereby corrected as shown below:

COLUMN 26:

Line 1, "according" should read --according to--.

Signed and Sealed this

Eighth Day of October, 1991

Attest:

HARRY F. MANBECK, JR.

*Attesting Officer*     *Commissioner of Patents and Trademarks*